US011843053B2

(12) United States Patent
Jung et al.

(10) Patent No.: US 11,843,053 B2
(45) Date of Patent: Dec. 12, 2023

(54) SEMICONDUCTOR DEVICES

(71) Applicant: SAMSUNG ELECTRONICS CO., LTD., Suwon-si (KR)

(72) Inventors: Su Jin Jung, Hwaseong-si (KR); Ki Hwan Kim, Seoul (KR); Sung Uk Jang, Hwaseong-si (KR); Young Dae Cho, Hwaseong-si (KR)

(73) Assignee: SAMSUNG ELECTRONICS CO., LTD.

( * ) Notice: Subject to any disclaimer, the term of this patent is extended or adjusted under 35 U.S.C. 154(b) by 101 days.

(21) Appl. No.: 17/398,550

(22) Filed: Aug. 10, 2021

(65) Prior Publication Data
US 2022/0181499 A1 Jun. 9, 2022

(30) Foreign Application Priority Data
Dec. 8, 2020 (KR) .................. 10-2020-0170065

(51) Int. Cl.
H01L 29/06 (2006.01)
H01L 29/786 (2006.01)
H01L 29/423 (2006.01)
H01L 29/66 (2006.01)
H01L 21/02 (2006.01)

(52) U.S. Cl.
CPC .... *H01L 29/78618* (2013.01); *H01L 21/0259* (2013.01); *H01L 29/0665* (2013.01); *H01L 29/42392* (2013.01); *H01L 29/66545* (2013.01); *H01L 29/66553* (2013.01); *H01L 29/66742* (2013.01); *H01L 29/78696* (2013.01)

(58) Field of Classification Search
CPC .......... H01L 29/0673; H01L 29/42392; H01L 29/66787; H01L 29/78696; H01L 29/66674–66734; H01L 29/7801–7826; H01L 29/04–045; H01L 29/16–1608; H01L 29/18–185; H01L 29/22–2206; H01L 29/36–365; H01L 29/0856–0869; H01L 29/0873–0886
See application file for complete search history.

(56) References Cited

U.S. PATENT DOCUMENTS

| 9,941,405 | B2 | 4/2018 | Kittl et al. |
| 10,079,305 | B2 | 9/2018 | Lee et al. |
| 10,361,202 | B2 | 7/2019 | Suh et al. |
| 10,553,696 | B2 | 2/2020 | Ando et al. |
| 10,714,387 | B2 | 7/2020 | Joe et al. |
| 2015/0295084 | A1* | 10/2015 | Obradovic ............ H01L 29/775 257/347 |

(Continued)

*Primary Examiner* — Eric A. Ward
*Assistant Examiner* — Zachary Taylor Nix
(74) *Attorney, Agent, or Firm* — Myers Bigel, P.A.

(57) ABSTRACT

A semiconductor device is provided. The semiconductor comprises an active pattern including a lower pattern and a plurality of sheet patterns that are spaced apart from the lower pattern in a first direction, a source/drain pattern on the lower pattern and in contact with the plurality of sheet patterns, and a gate structure on opposing sides of the source/drain pattern in a second direction different from the first direction, the gate structure including a gate electrode on the plurality of sheet patterns, wherein the source/drain pattern includes an epitaxial region that comprises a semiconductor material and a cavity region that is inside the epitaxial region and that is surrounded by the semiconductor material.

20 Claims, 23 Drawing Sheets

(56) References Cited

U.S. PATENT DOCUMENTS

| | | | |
|---|---|---|---|
| 2019/0081155 A1 | 3/2019 | Xie et al. | |
| 2019/0131394 A1* | 5/2019 | Reznicek | H01L 21/30604 |
| 2019/0157414 A1* | 5/2019 | Ando | H01L 21/02603 |
| 2020/0044023 A1* | 2/2020 | Reznicek | H01L 23/5329 |
| 2020/0105753 A1* | 4/2020 | Kotlyar | H01L 29/7845 |
| 2020/0219978 A1 | 7/2020 | Guler et al. | |
| 2020/0220018 A1 | 7/2020 | Jang et al. | |
| 2020/0373388 A1* | 11/2020 | Moroz | H01L 21/02532 |
| 2020/0373391 A1* | 11/2020 | Yi | H01L 29/775 |
| 2021/0234047 A1* | 7/2021 | Tsai | H01L 29/78612 |
| 2021/0296184 A1* | 9/2021 | Xie | H01L 21/8221 |
| 2022/0085013 A1* | 3/2022 | Reznicek | H01L 29/66742 |

\* cited by examiner

SEMICONDUCTOR DEVICES

CROSS-REFERENCE TO RELATED APPLICATION

This application claims priority from Korean Patent Application No. 10-2020-0170065 filed on Dec. 8, 2020, in the Korean Intellectual Property Office, and all the benefits accruing therefrom under 35 U.S.C. § 119, the contents of which in its entirety are herein incorporated by reference.

BACKGROUND

1. Field of the Invention

The present invention relates to semiconductor devices, and more specifically, to semiconductor devices including an MBCFET® (Multi-Bridge Channel Field Effect Transistor).

2. Description of the Related Art

A multi gate transistor in which a multi-channel active pattern (or silicon body) having a fin or nanowire shape is formed on a substrate, and a gate is formed on the multi-channel active pattern, has been proposed as a potential scaling technology for increasing the density of semiconductor devices.

Since such a multi gate transistor utilizes three-dimensional channels, increased scaling is possible. Further, even if a gate length of the multi gate transistor is not increased, current control capability can be improved. Furthermore, it is possible to effectively suppress a SCE (short channel effect) in which the potential of a channel region is influenced by a drain voltage.

SUMMARY

Aspects of the present invention provide semiconductor devices capable of improving element performance and reliability.

According to some aspects of the present inventive concept, there is provided a semiconductor device comprising an active pattern including a lower pattern and a plurality of sheet patterns, the plurality of sheet patterns spaced apart from the lower pattern in a first direction, a source/drain pattern on the lower pattern and in contact with the plurality of sheet patterns, and a gate structure on opposing sides of the source/drain pattern in a second direction different from the first direction, the gate structure including a gate electrode on the plurality of sheet patterns, wherein the source/drain pattern includes an epitaxial region that comprises a semiconductor material and a cavity region that is inside the epitaxial region and that is surrounded by the semiconductor material.

According to some aspects of the present inventive concept, there is provided a semiconductor device comprising an active pattern which includes a lower pattern and a plurality of sheet patterns, the plurality of sheet patterns spaced apart from the lower pattern in a first direction, a plurality of gate structures on the lower pattern that are spaced apart from each other in a second direction different from the first direction, the plurality of gate structure each including a gate electrode on one or more of the plurality of sheet patterns, a source/drain recess between a pair of the plurality of gate structures that are adjacent to each other in the second direction, and a source/drain pattern that is inside the source/drain recess on the lower pattern and is in contact with the one or more of the plurality of sheet patterns, wherein the source/drain pattern includes an epitaxial region that comprises a semiconductor material, and a cavity region that is inside the epitaxial region and that is surrounded by the semiconductor material, and wherein the epitaxial region includes a plurality of first epitaxial regions that are spaced apart from each other along a profile of the source/drain recess and a second epitaxial region that extends between the plurality of first epitaxial regions.

According to some aspects of the present inventive concept, there is provided a semiconductor device comprising an active pattern which includes a lower pattern and a plurality of sheet patterns, the plurality of sheet patterns spaced apart from the lower pattern in a first direction, a source/drain pattern on the lower pattern and in contact with the plurality of sheet patterns, and a gate structure on opposing sides of the source/drain pattern in a second direction different from the first direction, wherein the gate structure includes a gate electrode on the plurality of sheet patterns and an inner spacer between a pair of the plurality of sheet patterns that are adjacent to each other in the first direction, wherein the source/drain pattern includes an epitaxial region that comprises a semiconductor material and an inner air gap that is inside the epitaxial region and that is surrounded by the semiconductor material, and wherein the inner air gap is not in contact with the inner spacer.

However, aspects of the present invention are not restricted to the ones set forth herein. The above and other aspects of the present invention will become more apparent to one of ordinary skill in the art to which the present invention pertains by referencing the detailed description of the present invention given below.

DETAILED DESCRIPTION

A semiconductor device according to some embodiments of the present invention may include a tunneling transistor (tunneling FET), a three-dimensional (3D) transistor, or a two-dimensional material-based transistor (2D material based FET), and a heterostructure thereof. Also, a semiconductor device according to some embodiments of the present invention may also include a bipolar junction transistor, a laterally diffused metal oxide semiconductor (LDMOS), or the like.

The semiconductor device according to some embodiments of the present invention will be described referring to FIGS. 1 to 4B.

Figure 1:
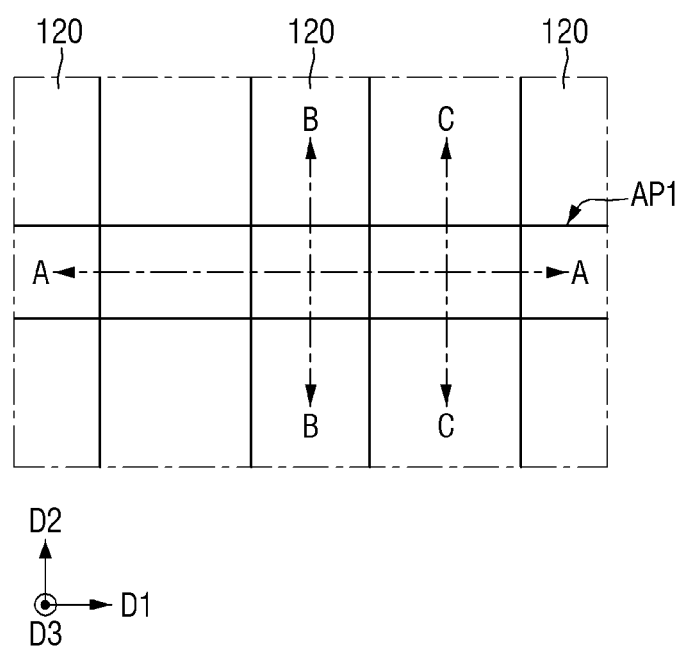
FIG. 1 is an example layout view of a semiconductor device according to some embodiments of the present invention.
Figure 2:
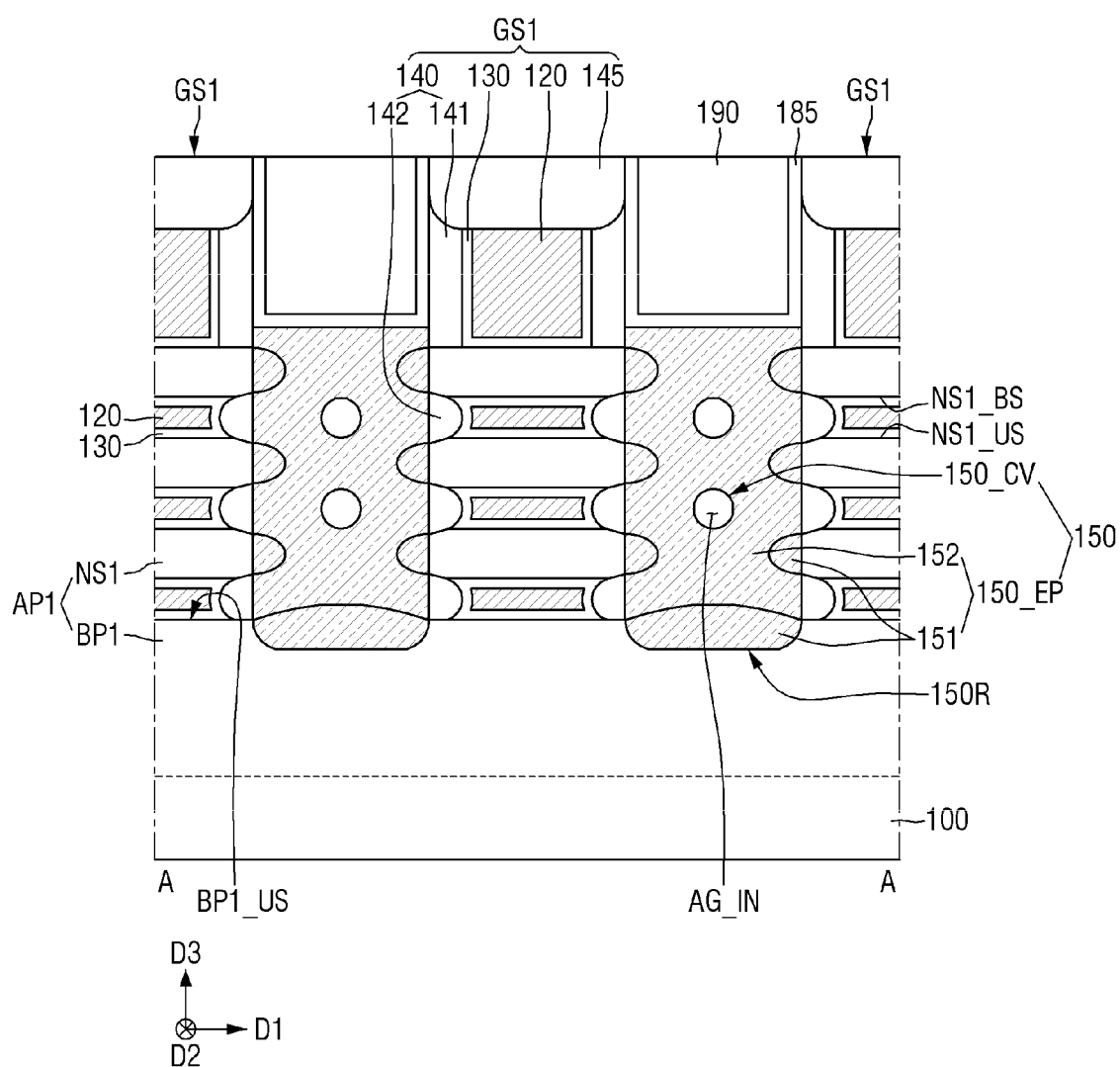
FIG. 2 is a cross-sectional view taken along the line A-A of FIG. 1.
Figure 3:
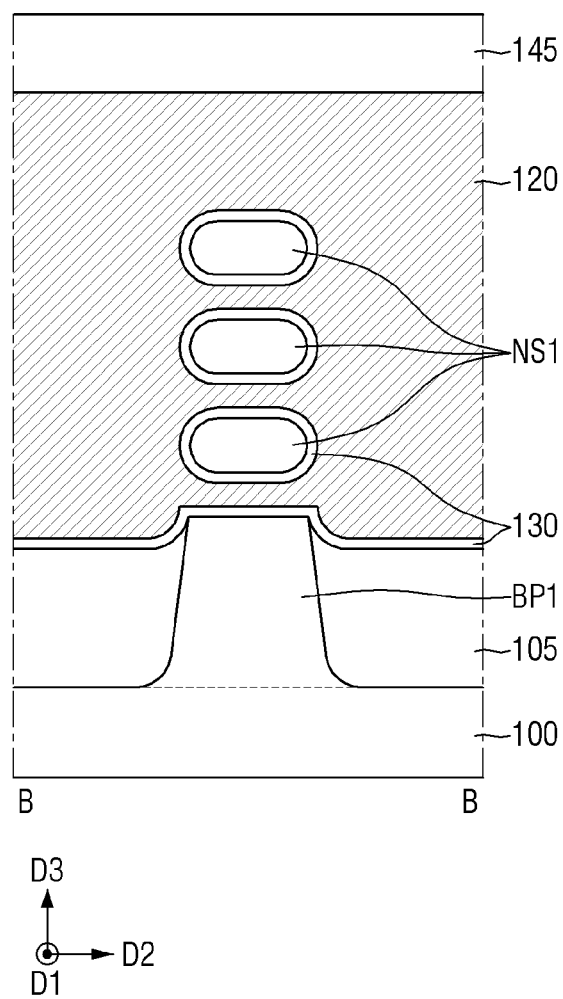
FIG. 3 is a cross-sectional view taken along the line B-B of FIG. 1.
Figure 4A:
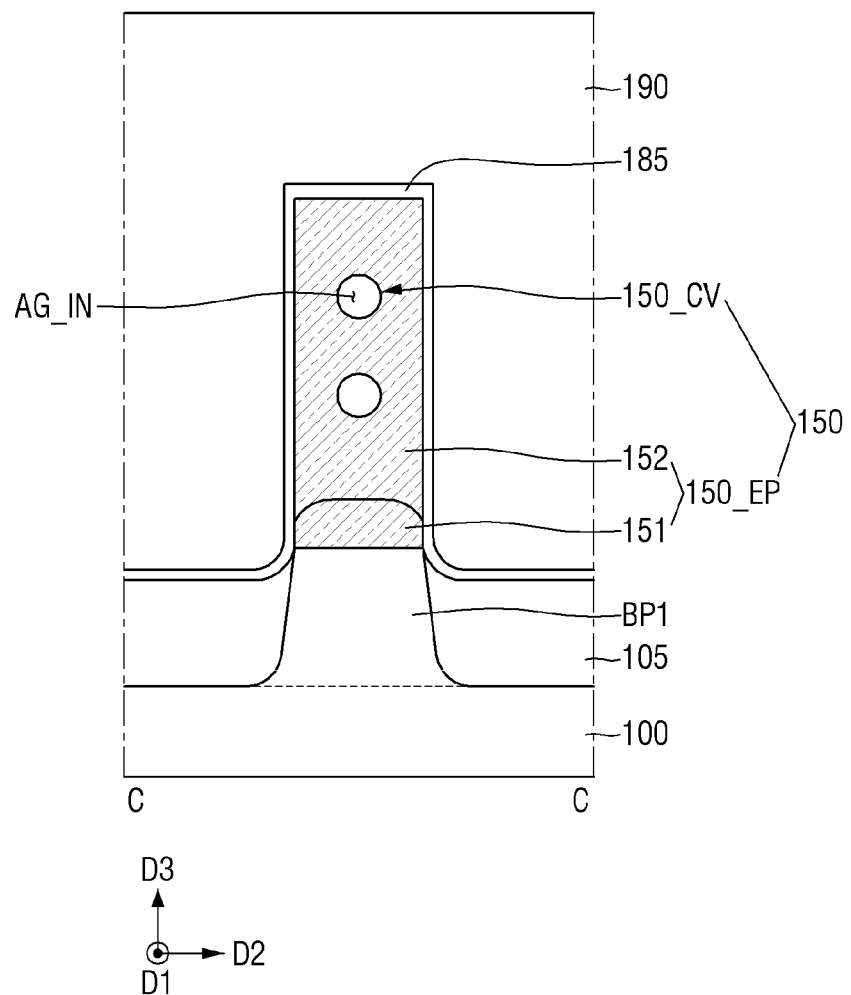
FIGS. 4A and 4B are cross-sectional views taken along the line C-C of FIG. 1, respectively.
Figure 4B:
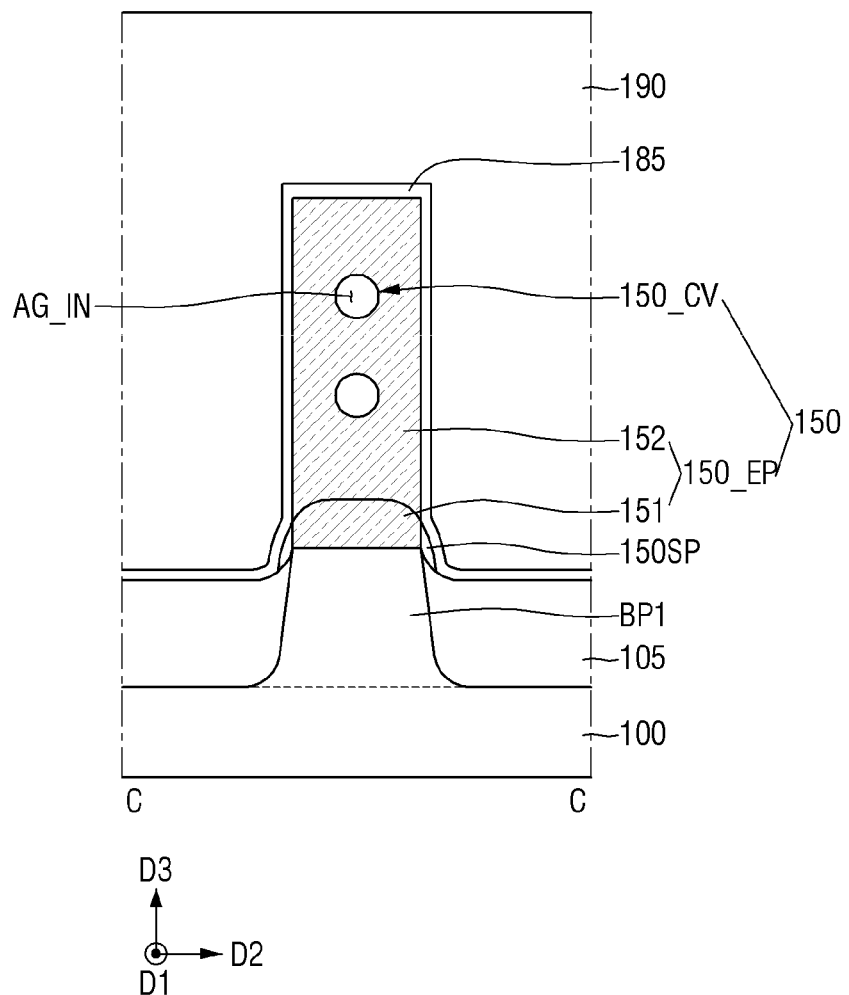

FIG. 1 is an example layout view of a semiconductor device according to some embodiments of the present invention. FIG. 2 is a cross-sectional view taken along the line A-A of FIG. 1. FIG. 3 is a cross-sectional view taken along the line B-B of FIG. 1. FIGS. 4A and 4B are cross-sectional views taken along the line C-C of FIG. 1, respectively.

Referring to FIGS. 1 to 4B, the semiconductor device according to some embodiments may include a first active pattern AP1, a plurality of first gate electrodes 120, and a first source/drain pattern 150.

A substrate 100 may be bulk silicon or an SOI (silicon-on-insulator). In contrast, the substrate 100 may be a silicon substrate, or may include other materials, but are not limited to, for example, silicon germanium, SGOI (silicon germanium on insulator), indium antimonide, lead tellurium compounds, indium arsenic, indium phosphide, gallium arsenide or gallium antimonide.

A first active pattern AP1 may be placed on the substrate 100. Each of the first active patterns AP1 may extend long (e.g., have a longitudinal axis extending) in a first direction D1. For example, the first active pattern AP1 may be placed in a region in which a NMOS device is formed.

The first active pattern AP1, for example, may be a multi-channel active pattern. The first active pattern AP1 may include a first lower pattern BP1 and a plurality of first sheet patterns NS1.

The first lower pattern BP1 may protrude from the substrate 100. The first lower pattern BP1 may extend long in the first direction D1.

A plurality of first sheet patterns NS1 may be placed on an upper surface BP1_US of the first lower pattern. The plurality of first sheet patterns NS1 may be spaced apart from the first lower pattern BP1 in a third direction D3. Each of the first sheet patterns NS1 may be spaced apart from each other in the third direction D3.

Each first sheet pattern NS1 may include an upper surface NS1_US and a lower surface NS1_BS. The upper surface NS1_US of the first sheet pattern is a surface that is opposite to the lower surface NS1_BS of the first sheet pattern in the third direction D3. The third direction D3 may be a direction that intersects the first direction D1 and the second direction D2. For example, the third direction D3 may be a thickness direction of the substrate 100. The first direction D1 may be a direction that intersects the second direction D2.

Although three first sheet patterns NS1 are shown as being placed in the third direction D3, this is only for convenience of explanation, and the embodiments of the present invention are not limited thereto.

The first lower pattern BP1 may be formed by etching a part of the substrate 100, and may include an epitaxial layer that is grown from the substrate 100. The first lower pattern BP1 may include silicon or germanium, which is an elemental semiconductor material. Further, the first lower pattern BP1 may include a compound semiconductor, and may include, for example, a group IV-IV compound semiconductor or a group III-V compound semiconductor.

The group IV-IV compound semiconductor may be, for example, a binary compound or a ternary compound including at least two or more of carbon (C), silicon (Si), germanium (Ge), and tin (Sn), or a compound obtained by doping these elements with a group IV element.

The group III-V compound semiconductor may be, for example, one of a binary compound, a ternary compound, or a quaternary compound formed by combining at least one of aluminum (Al), gallium (Ga) and indium (In) as a group III element with one of phosphorus (P), arsenic (As) and antimony (Sb) as a group V element.

The first sheet pattern NS1 may include one of silicon or germanium, which is an elemental semiconductor material, a group IV-IV compound semiconductor, or a group III-V compound semiconductor. Each first sheet pattern NS1 may include the same material as the first lower pattern BP1, or may include a material different from the first lower pattern BP1.

In the semiconductor device according to some embodiments, the first lower pattern BP1 may be a silicon lower pattern including silicon, and the first sheet pattern NS1 may be a silicon sheet pattern including silicon.

A width of the first sheet pattern NS1 in the second direction D2 may be increased or decreased in proportion to a width of the first lower pattern BP1 in the second direction D2. As an example, although the width in the second direction D2 of the first sheet patterns NS1 stacked in the third direction D3 is shown as being the same, this is only for convenience of explanation, and the embodiments of the present invention are not limited thereto. Unlike the shown configuration, as it goes away from the first lower pattern BP1, the width in the second direction D2 of the first sheet patterns NS1 stacked in the third direction D3 may decrease.

A field insulating film 105 may be formed on the substrate 100. The field insulating film 105 may be placed on the side walls of the first lower pattern BP1. The field insulating film 105 may not be placed on the upper surface BP1_US of the first lower pattern.

As an example, the field insulating film 105 may be on and, in some embodiments, entirely cover the side walls of the first lower pattern BP1. Unlike the shown configuration, the field insulating film 105 may cover a part of the side walls of the first lower pattern BP1 in some embodiments. In such a case, a part of the first lower pattern BP1 may protrude in the third direction D3 beyond the upper surface of the field insulating film 105.

Each first sheet pattern NS1 is placed to be higher than the upper surface of the field insulating film 105. The field insulating film 105 may include, for example, an oxide film, a nitride film, an oxynitride film, or a combination film thereof. Although the field insulating film 105 is shown as a single film, this is only for convenience of explanation, and the embodiments of the present invention are not limited thereto.

A plurality of first gate structures GS1 may be placed on the substrate 100. Each first gate structure GS1 may extend in the second direction D2. Adjacent first gate structures GS1 may be spaced apart from each other in the first direction D1.

The first gate structure GS1 may be placed on the first active pattern AP1. The first gate structure GS1 may intersect the first active pattern AP1.

The first gate structure GS1 may intersect the first lower pattern BP1. The first gate structure GS1 may be on and/or surround each first sheet pattern NS1. It will be understood that "an element A surrounds an element B" (or similar language) as used herein means that the element A is at least partially around the element B but does not necessarily mean that the element A completely encloses the element B.

The first gate structure GS1 may include, for example, a first gate electrode 120, a first gate insulating film 130, a first gate spacer 140, and a first gate capping pattern 145.

The first gate electrode 120 may be formed on the first lower pattern BP1. The first gate electrode 120 may intersect the first lower pattern BP1. The first gate electrode 120 may surround the first sheet pattern NS1.

A part of the first gate electrode 120 may be placed between the first sheet patterns NS1 adjacent to each other in the third direction D3. When the first sheet pattern NS1 includes a first_1 sheet pattern and a first_2 sheet pattern adjacent to each other, a part of the first gate electrode 120 may be placed between the upper surface NS1_US of the first_1 sheet pattern and the lower surface NS1_BS of the first_2 sheet pattern facing each other.

The first gate electrode 120 may include at least one of a metal, a metal alloy, a conductive metal nitride, a metal silicide, a doped semiconductor material, a conductive metal oxide, and/or a conductive metal oxynitride. The first gate electrode 120 may include, but is not limited to, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and combinations thereof. The conductive metal oxides and the conductive metal oxynitrides may include, but are not limited to, the oxidized forms of the aforementioned materials.

The first gate electrode 120 may be placed on both sides of a first source/drain pattern 150 to be described below. The first gate structure GS1 may be placed on both sides of the first source/drain pattern 150 in the first direction D1.

As an example, both the first gate electrodes 120 placed on either side of the first source/drain pattern 150 may be a normal gate electrode used for a gate of the transistor. As another example, although the first gate electrode 120 placed on one side of the first source/drain pattern 150 is used as the gate of the transistor, the first gate electrode 120 placed on the other side of the first source/drain pattern 150 may be a dummy gate electrode (e.g., not functioning as a gate of a transistor).

The first gate insulating film 130 may extend along the upper surface of the field insulating film 105 and the upper surface BP1_US of the first lower pattern. The first gate insulating film 130 may be on and/or surround the first sheet pattern NS1. The first gate insulating film 130 may be placed along the periphery of the first sheet pattern NS1. The first gate electrode 120 may be placed on the first gate insulating film 130. The first gate insulating film 130 may be placed between the first gate electrode 120 and the first sheet pattern NS1.

A part of the first gate insulating film 130 may be placed between the first sheet patterns NS1 adjacent to each other in the third direction D3. When the first sheet pattern NS1 includes a first_1 sheet pattern and a first_2 sheet pattern adjacent to each other, a part of the first gate insulating film 130 may extend along the upper surface NS1_US of the first_1 sheet pattern and the lower surface NS1_BS of the first_2 sheet pattern facing each other.

The first gate insulating film 130 may include silicon oxide, silicon oxynitride, silicon nitride, and/or a high dielectric constant material having a higher dielectric constant than that of silicon oxide. The high dielectric constant material may include, for example, one or more of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

The semiconductor device according to some embodiments may include an NC (Negative Capacitance) FET that uses a negative capacitor. For example, the first gate insulating film 130 may include a ferroelectric material film having ferroelectric properties, and a paraelectric material film having paraelectric properties.

The ferroelectric material film may have a negative capacitance, and the paraelectric material film may have a positive capacitance. For example, if two or more capacitors are connected in series and the capacitance of each capacitor has a positive value, the overall capacitances decrease from the capacitance of each of the individual capacitors. On the other hand, when at least one of the capacitances of two or more capacitors connected in series has a negative value, the overall capacitance may be greater than an absolute value of each of the individual capacitances, while having a positive value.

When the ferroelectric material film having the negative capacitance and the paraelectric material film having the positive capacitance are connected in series, the overall capacitance value of the ferroelectric material film and the paraelectric material film connected in series may increase. Taking advantage of the increased overall capacitance value, a transistor including the ferroelectric material film may have a subthreshold swing (SS) of less than 60 mV/decade at room temperature.

The ferroelectric material film may have ferroelectric properties. The ferroelectric material film may include, for example, at least one of hafnium oxide, hafnium zirconium oxide, barium strontium titanium oxide, barium titanium oxide, and lead zirconium titanium oxide. Here, as an example, the hafnium zirconium oxide may be a material obtained by doping hafnium oxide with zirconium (Zr). As another example, the hafnium zirconium oxide may be a compound of hafnium (Hf), zirconium (Zr), and oxygen (O).

The ferroelectric material film may further include a doped dopant. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). The type of dopant included in the ferroelectric material film may vary, depending on which type of ferroelectric material is included in the ferroelectric material film.

When the ferroelectric material film includes hafnium oxide, the dopant included in the ferroelectric material film may include, for example, at least one of gadolinium (Gd), silicon (Si), zirconium (Zr), aluminum (Al), and yttrium (Y).

When the dopant is aluminum (Al), the ferroelectric material film may include 3 to 8 at % (atomic %) aluminum. Here, a ratio of the dopant may be a ratio of aluminum to the sum of hafnium and aluminum.

When the dopant is silicon (Si), the ferroelectric material film may include 2 to 10 at % silicon. When the dopant is yttrium (Y), the ferroelectric material film may include 2 to 10 at % yttrium. When the dopant is gadolinium (Gd), the ferroelectric material film may include 1 to 7 at % gadolinium. When the dopant is zirconium (Zr), the ferroelectric material film may include 50 to 80 at % zirconium.

The paraelectric material film may have the paraelectric properties. The paraelectric material film may include at least one of, for example, a silicon oxide and a metal oxide having a high dielectric constant. The metal oxide included in the paraelectric material film may include, for example, but is not limited to, at least one of hafnium oxide, zirconium oxide, and aluminum oxide.

The ferroelectric material film and the paraelectric material film may include the same material. The ferroelectric material film has the ferroelectric properties, but the paraelectric material film may not have the ferroelectric properties. For example, when the ferroelectric material film and the paraelectric material film include hafnium oxide, a crystal structure of hafnium oxide included in the ferroelectric material film may be different from a crystal structure of hafnium oxide included in the paraelectric material film.

The ferroelectric material film may have a thickness having the ferroelectric properties. The thickness of the ferroelectric material film may be, for example, but is not limited to, 0.5 to 10 nm. Since a critical thickness that exhibits the ferroelectric properties may vary for each ferroelectric material, the thickness of the ferroelectric material film may vary depending on the ferroelectric material.

As an example, the first gate insulating film 130 may include one ferroelectric material film. As another example, the first gate insulating film 130 may include a plurality of ferroelectric material films spaced apart from each other. The first gate insulating film 130 may have a stacked film structure in which the plurality of ferroelectric material films and the plurality of paraelectric material films are alternately stacked.

The first gate spacer 140 may be placed on the side walls of the first gate electrode 120. The first gate spacer 140 may include an outer spacer 141 and an inner spacer 142.

The inner spacer 142 may be placed between the first sheet patterns NS1 adjacent to each other in the third direction D3. The inner spacer 142 may be placed between the first lower pattern BP1 and the first sheet pattern NS1 placed at the lowermost part.

The first gate insulating film 130 placed between the adjacent first sheet patterns NS1 may be in contact with the inner spacer 142. The first gate insulating film 130 may extend along the profile of the inner spacer 142.

A portion of the first nanosheet NS1 that forms a boundary with the inner spacer 142 may have a slope. During the fabricating process of making the inner spacer 142, a part of the first nanosheet NS1 may be etched. That is, in FIG. 2, in the portion of the first nanosheet NS1 that forms the boundary with the inner spacer 142, the thickness of the first nanosheet NS1 in the third direction D3 may decrease toward the first source/drain pattern 150.

Unlike the shown configuration, in FIG. 2, in the portion of the first nanosheet NS1 that forms the boundary with the inner spacer 142, the thickness of the first nanosheet NS1 in the third direction D3 may be constant toward the first source/drain pattern 150.

The outer spacer 141 and the inner spacer 142 may include, for example, at least one of silicon nitride (SiN), silicon oxynitride (SiON), silicon oxide ($SiO_2$), silicon oxycarbonitride (SiOCN), silicon boronitride (SiBN), silicon oxyboronitride (SiOBN), silicon oxycarbide (SiOC), and combinations thereof.

The first gate capping pattern 145 may be placed on the first gate electrode 120 and the first gate spacer 140. An upper surface of the first gate capping pattern 145 may be placed on the same plane as an upper surface of an interlayer insulating film 190. Unlike the shown configuration, the first gate capping pattern 145 may be placed between the first gate spacers 140.

The first gate capping pattern 145 may include, for example, at least one of silicon nitride (SiN), silicon oxynitride (SiON), silicon carbonitride (SiCN), silicon oxycarbonitride (SiOCN), and combinations thereof. The first gate capping pattern 145 may include a material having an etching selectivity to the interlayer insulating film 190.

The first source/drain pattern 150 may be formed on the first active pattern AP1. The first source/drain pattern 150 may be formed on the first lower pattern BP1. The first source/drain pattern 150 may be connected to the first sheet pattern NS1. The first source/drain pattern 150 may be in contact with the first sheet pattern NS1.

The first source/drain pattern 150 may be placed on the side surfaces of the first gate structure GS1. The first source/drain pattern 150 may be placed between the first gate structures GS1 adjacent to each other in the first direction D1. For example, the first source/drain pattern 150 may be placed on both sides of the first gate structure GS1. Unlike the shown configuration, the first source/drain pattern 150 may be placed on one side of the first gate structure GS1, and may not be placed on the other side of the first gate structure GS1.

The first source/drain pattern 150 may be included in a source/drain of a transistor that uses the first sheet pattern NS1 as a channel region.

The first source/drain pattern 150 may be placed inside a first source/drain recess 150R. The first source/drain recess 150R extends in the third direction D3. A bottom surface of the first source/drain recess 150R may be defined by the first lower pattern BP1. The side walls of the first source/drain recess 150R may be defined by the first nanosheet NS1, the inner spacer 142 and the first gate structure GS1. The inner spacer 142 is placed between the first gate electrode 120 between the adjacent first nanosheets NS1 and the first source/drain pattern 150. The first gate insulating film 130 may not be in contact with the first source/drain pattern 150.

Between the lowermost first nanosheet NS1 and the first lower pattern BP1, the boundary between the first gate insulating film 130 and the first lower pattern BP1 may be an upper surface BP1_US of the first lower pattern. In other words, in FIG. 2, the first gate structure GS1 may include a lowermost sub-gate structure placed between the first lower pattern BP1 and the lowermost first nanosheet NS1. The lowermost sub-gate structure may include a part of the first gate electrode 120 and a part of the first gate insulating film 130. The upper surface BP1_US of the first lower pattern may be a boundary between the lowermost sub-gate structure and the first lower pattern BP1. The bottom surface of the first source/drain recess 150R may be lower than the upper surface BP1_US of the first lower pattern at the boundary between the lowermost sub-gate structure and the first lower pattern BP1.

The width in the first direction D1 of the first source/drain recess 150R as defined by the first nanosheet NS1 and the inner spacer 142 may be constant. Unlike the shown configuration, as an example, the width in the first direction D1 of the first source/drain recess 150R as defined by the lowermost sub-gate structure described above may increase and then be constant, as it goes away from the upper surface BP1_US of the first lower pattern.

Unlike the shown configuration, as another example, the width in the first direction D1 of the first source/drain recess 150R as defined by the first nanosheet NS1 and the first gate structure GS1 may increase as it goes away from the first lower pattern BP1. That is, the side walls of the first source/drain recess 150R may have a shape similar to that of an inverted trapezoidal side wall.

The first source/drain pattern 150 may include an epitaxial region 150_EP and a cavity region 150_CV. The cavity region 150_CV is placed inside the epitaxial region 150_EP.

The epitaxial region 150_EP is formed of a semiconductor material. The epitaxial region 150_EP may be made up of a semiconductor material pattern formed by an epitaxial growth method. The epitaxial region 150_EP may include, for example, silicon doped with n-type impurities.

In the semiconductor device according to some embodiments, the epitaxial region 150_EP may include a plurality of first epitaxial regions 151 and a second epitaxial region 152.

The plurality of first epitaxial regions 151 may be placed along the profile of the first source/drain recess 150R. Each of the first epitaxial regions 151 may be formed to be spaced apart from each other.

The first epitaxial region 151 may be formed on the first lower pattern BP1. The first epitaxial region 151 may be formed at the termination of each first sheet pattern NS1 that defines the first source/drain recess 150R. The first epitaxial region 151 formed at the termination of each first sheet pattern NS1 may be spaced apart from each other. The first epitaxial region 151 is in contact with the first lower pattern BP1 and the first sheet pattern NS1. The first epitaxial region 151 formed at the termination of the first sheet pattern NS1 may not extend along the first source/drain recess 150R defined by the inner spacer 142. In some embodiments, the first epitaxial region 151 may not extend along an interface between the first source/drain recess 150R and the inner spacer 142.

For example, the first epitaxial region 151 may include silicon doped with first n-type impurities. For example, the first n-type impurities may be arsenic (As).

The second epitaxial region 152 connects the first epitaxial regions 151 spaced apart from each other. The second epitaxial region 152 is in contact with the first epitaxial region 151.

For example, the second epitaxial region 152 may include silicon doped with second n-type impurities. The second n-type impurities may differ from first n-type impurities. For example, the second n-type impurities may be phosphorus (P).

The semiconductor material that forms the epitaxial region 150_EP may entirely surround the cavity region 150_CV inside the epitaxial region 150_EP. The surface of the cavity region 150_CV may be defined by the semiconductor material that forms the epitaxial region 150_EP.

The first gate electrode 120 placed between the first sheet patterns NS1 adjacent to each other in the third direction D3 may overlap the cavity region 150_CV in the first direction D1. The cavity region 150_CV may overlap the inner spacer 142 in the first direction D1. When a first inner spacer and a second inner spacer are located with the first source/drain pattern 150 interposed between them at the same height level based on the upper surface BP1 of the first lower pattern, the cavity region 150_CV is placed between the first inner spacer and the second inner spacer.

The cavity region 150_CV is spatially spaced apart from the inner spacer 142 in the first direction D1. The surface of the cavity region 150_CV does not include the portion defined by the inner spacer 142.

The cavity region 150_CV may be placed inside the second epitaxial region 152. The cavity region 150_CV is surrounded by the semiconductor material included in the second epitaxial region 152. The surface of the cavity region 150_CV may be defined by the semiconductor material included in the second epitaxial region 152.

The cavity region 150_CV may include an inner air gap AG_IN. The inner air gap AG_IN is surrounded by the surface of the cavity region 150_CV. The second epitaxial region 152 entirely surrounds the inner air gap AG_IN. The semiconductor material included in the second epitaxial region 152 entirely surrounds the inner air gap AG_IN.

The first gate electrode 120 placed between the first sheet patterns NS1 adjacent to each other in the third direction D3 may overlap the inner air gap AG_IN in the first direction D1. The inner air gap AG_IN may overlap the inner spacer 142 in the first direction D1. The inner air gap AG_IN may not be in contact with the inner spacer 142.

In FIGS. 4A and 4B, the first source/drain pattern 150 is shown as having a rectangular cross section, but is not limited thereto. Although the side walls of the first source/drain pattern 150 and the upper surface of the first source/drain pattern 150 are shown as having a linear shape, this is only for convenience of explanation, and the embodiments of the present invention are not limited thereto.

In FIG. 4A, there is no epi-spacer placed on the side walls of the first source/drain pattern 150.

In FIG. 4B, the epi-spacer 150SP may be placed in a part of the side walls of the first source/drain pattern 150. The epi-spacer 150SP may be placed on the upper surface of the field insulating film 105. The epi-spacer 150SP may include, for example, at least one of silicon nitride (SiN), silicon oxynitride (SiON), silicon oxide ($SiO_2$), silicon oxycarbonitride (SiOCN), silicon boronitride (SiBN), silicon oxyboronitride (SiOBN), silicon oxycarbide (SiOC), and combinations thereof.

The first source/drain pattern 150 is shown to include, but is not limited to, two cavity regions 150_CV. Unlike the shown configuration, the first source/drain pattern 150 may include one cavity region 150_CV. Alternatively, the first source/drain pattern 150 may also include three or more cavity regions 150_CV.

Also, the first source/drain pattern 150 may include a width-center line located at the same distance from the first gate structures GS1 adjacent to each other in the first direction D1. The width-center line of the first source/drain recess 150 may extend in the third direction D3 (e.g., along a center of the first source/drain pattern 150 in the first direction D1). Although the cavity region 150_CV is shown as being located on the width-center line of the first source/drain pattern 150, this is only for convenience of explanation, and the embodiment is not limited thereto. Unlike the shown configuration, at least one or more cavity regions 150_CV may be biased in any one direction from the width-center line of the first source/drain pattern 150.

In FIGS. 2 and 4A, although the cavity region 150_CV is shown as having a circular cross section, this is only for convenience of explanation, and the embodiments of the present invention are not limited thereto. The cross section of the cavity region 150_CV may have a triangular or quadrangular shape. For example, in such a case, when the cavity region 150_CV has a triangular cross section, the triangle may be formed by a combination of straight lines and/or curves.

An etching stop film 185 may be placed on the upper surface of the field insulating film 105, the side wall of the first gate structure GS1, the upper surface of the first source/drain pattern 150, and the side wall of the first source/drain pattern 150. The etching stop film 185 may include a material having an etching selectivity with respect to an interlayer insulating film 190 to be described later. The etching stop film 185 may include, for example, at least one of silicon nitride (SiN), silicon oxynitride (SiON), silicon oxycarbonitride (SiOCN), silicon boronitride (SiBN), silicon oxyboronitride (SiOBN), silicon oxycarbide (SiOC), and combinations thereof.

The interlayer insulating film 190 may be placed on the etching stop film 185. The interlayer insulating film 190 may be placed on the field insulating film 105 and the first source/drain pattern 150. The interlayer insulating film 190 may not cover the upper surface of the first gate capping pattern 145. For example, the upper surface of the interlayer insulating film 190 may be placed on the same plane as the upper surface of the first gate capping pattern 145.

The interlayer insulating film 190 may include, for example, at least one of silicon oxide, silicon nitride, silicon oxynitride, and/or a low dielectric constant material. The low dielectric constant material may include for example, but is not limited to, Fluorinated TetraEthylOrthoSilicate (FTEOS), Hydrogen SilsesQuioxane (HSQ), Bis-benzoCycloButene (BCB), TetraMethylOrthoSilicate (TMOS), OctaMethyleyCloTetraSiloxane (OMCTS), HexaMethylDiSiloxane (HMDS), TriMethylSilyl Borate (TMSB), DiAcetoxyDitertiaryButoSiloxane (DADBS), TriMethylSilil Phosphate (TMSP), PolyTetraFluoroEthylene (PTFE), TOSZ (Tonen SilaZen), FSG (Fluoride Silicate Glass), polyimide nanofoams such as polypropylene oxide, CDO (Carbon Doped silicon Oxide), OSG (Organo Silicate Glass), SiLK, Amorphous Fluorinated Carbon, silica aerogels, silica xerogels, mesoporous silica, or combinations thereof.

Figure 5:
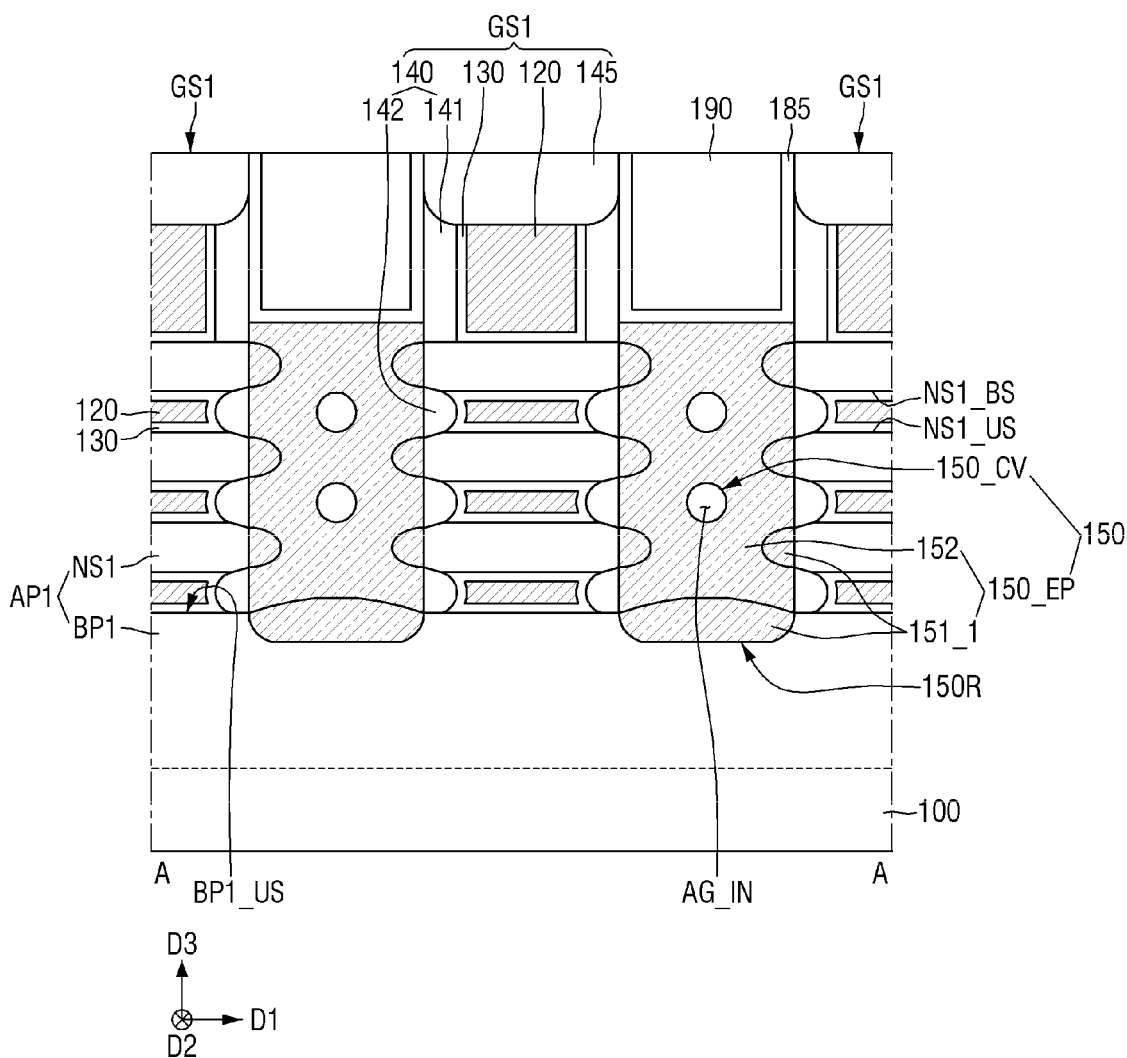
FIG. 5 is a diagram of a semiconductor device according to some embodiments of the present invention.
Figure 6:
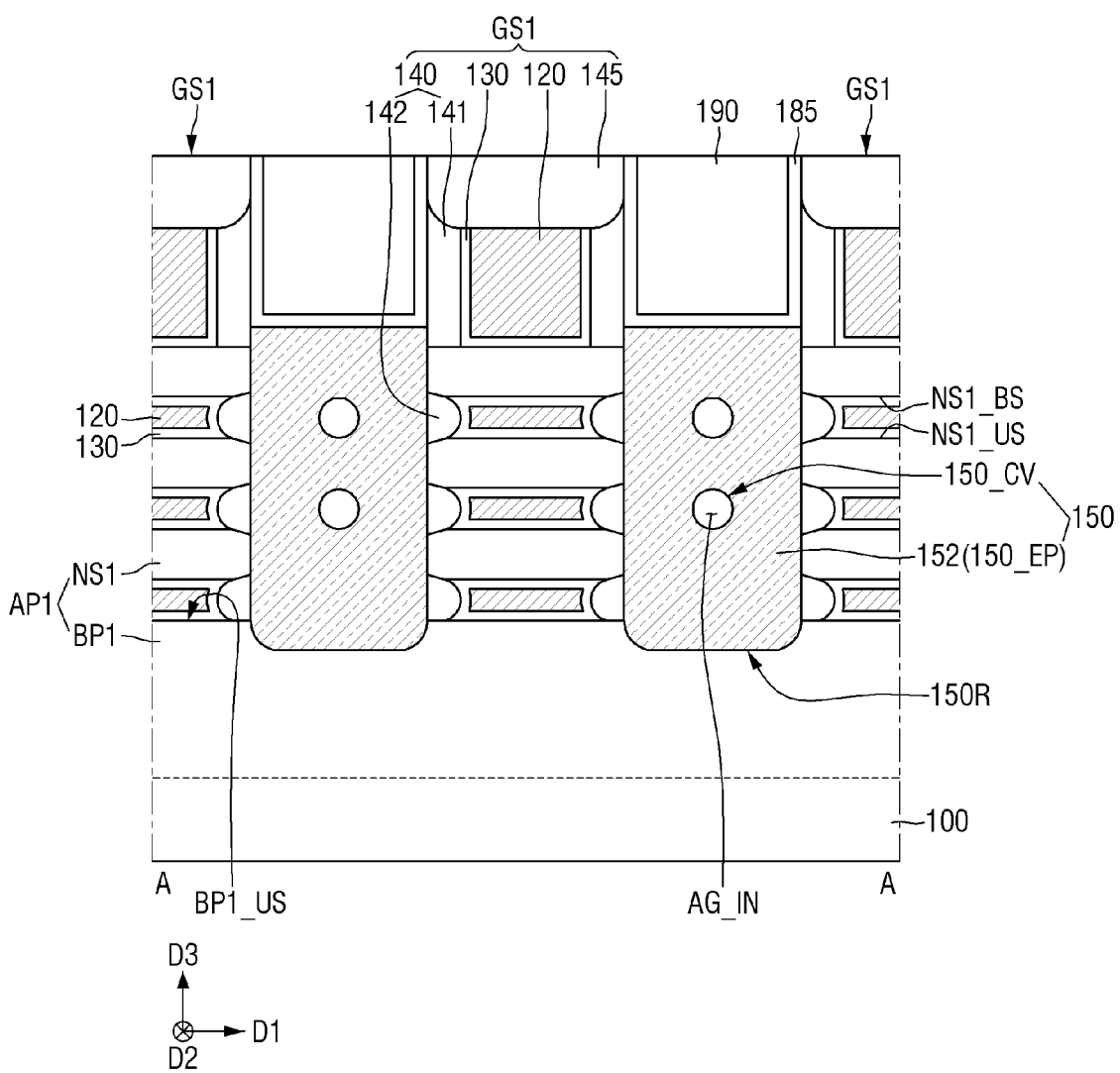
FIG. 6 is a diagram of a semiconductor device according to some embodiments of the present invention.

FIG. 5 is a diagram of a semiconductor device according to some embodiments of the present invention. FIG. 6 is a diagram of a semiconductor device according to some embodiments of the present invention. For convenience of explanation, the points different from those described using FIGS. 1 to 4B will be mainly described.

Referring to FIG. 5, in the semiconductor device according to some embodiments, the epitaxial region 150_EP may include a plurality of a first_1 epitaxial regions 151_1 and a second epitaxial region 152.

The first_1 epitaxial region 151_1 and the second epitaxial region 152 may include silicon doped with second n-type impurities. That is, for example, the first_1 epitaxial region 151_1 and the second epitaxial region 152 may include silicon doped with phosphorus (P).

A concentration (/cm$^3$) of phosphorus (P) of the second epitaxial region 152 may be higher than a concentration (/cm$^3$) of phosphorus (P) of the first_1 epitaxial region 151_1.

Referring to FIG. 6, in the semiconductor device according to some embodiments, the epitaxial region 150_EP may include a second epitaxial region 152.

The second epitaxial region 152 may be in contact with the first lower pattern BP1 and the first sheet pattern NS1.

Figure 7:
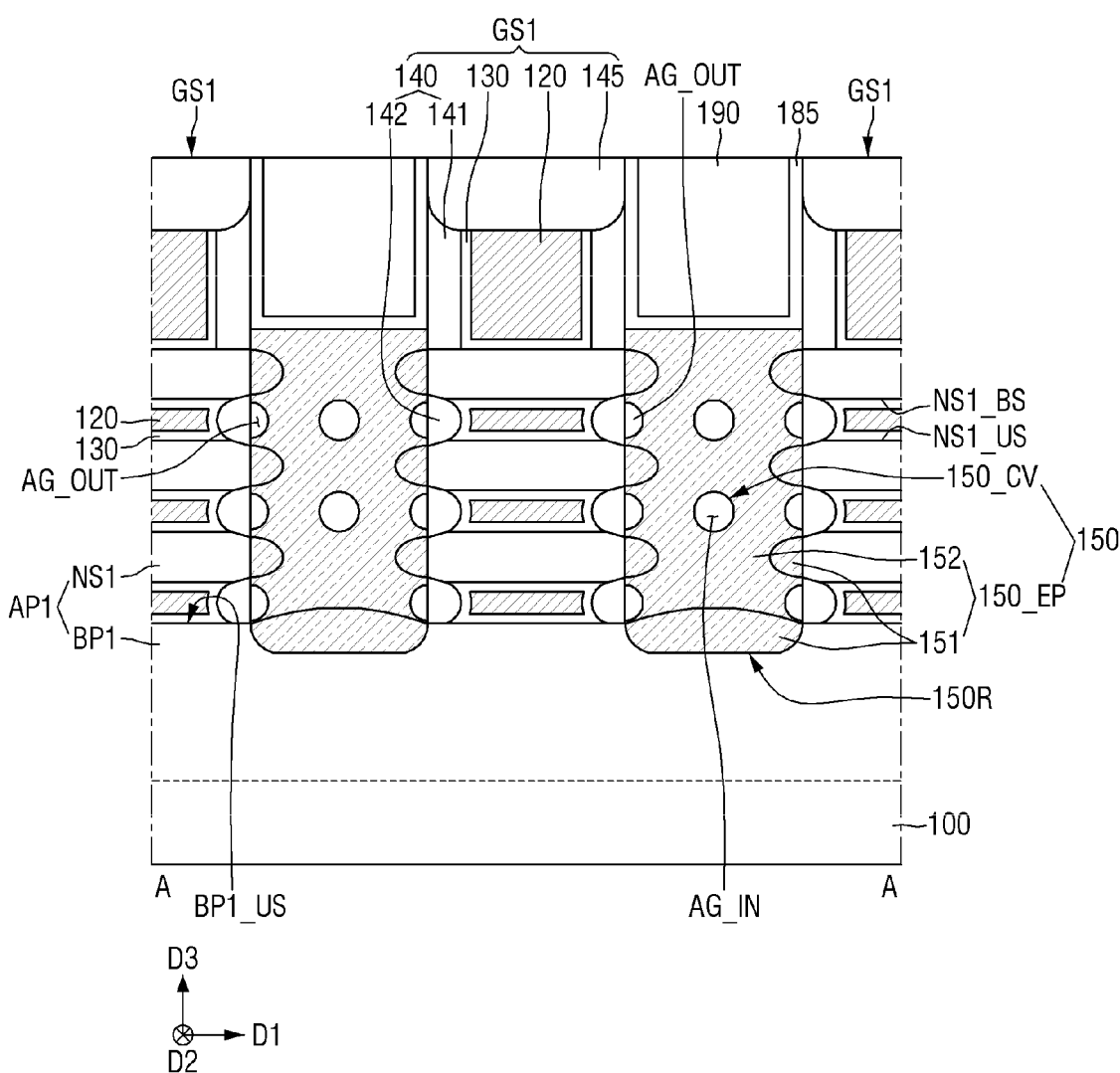
FIG. 7 is a diagram of a semiconductor device according to some embodiments of the present invention.

FIG. 7 is a diagram of a semiconductor device according to some embodiments of the present invention. For convenience of explanation, the points different from those described using FIGS. 1 to 4B will be mainly described.

Referring to FIG. 7, the semiconductor device according to some embodiments may further include an outer air gap AG_OUT placed between the inner spacer 142 and the first source/drain pattern 150.

The outer air gap AG_OUT may be surrounded by the inner spacer 142 and the epitaxial region 150_EP. The outer air gap AG_OUT may be surrounded by the inner spacer 142 and the second epitaxial region 152.

The outer air gap AG_OUT is in contact with the inner spacer 142. The outer air gap AG_OUT may be surrounded by the surface of the inner spacer 142 and the semiconductor material included in the epitaxial region 150_EP.

Unlike the shown configuration, the outer air gap AG_OUT may be placed in some part between the inner spacer 142 and the first source/drain pattern 150.

Figure 8:
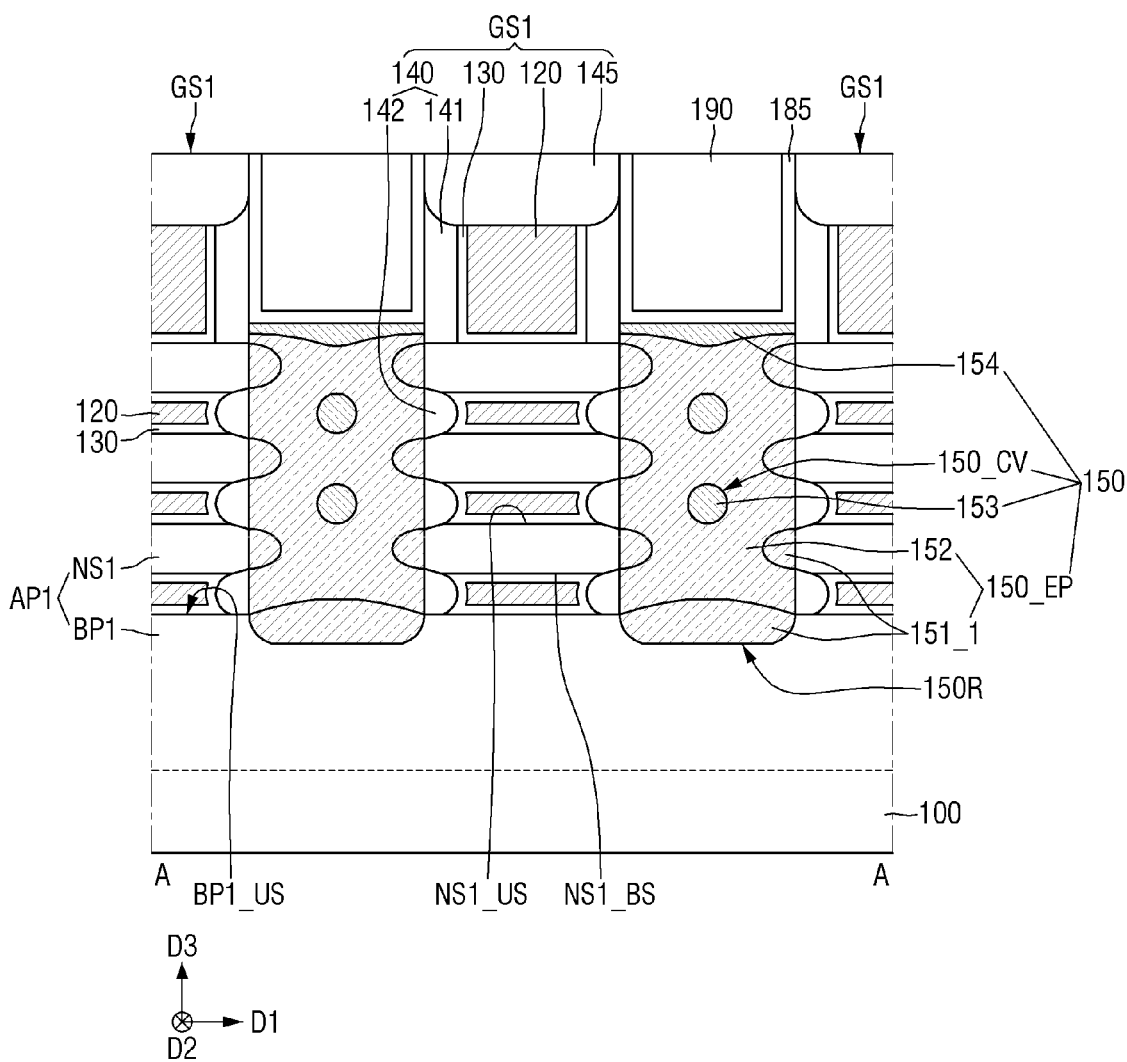
FIGS. 8 to 10 are diagrams of a semiconductor device according to some embodiments of the present invention.
Figure 9:
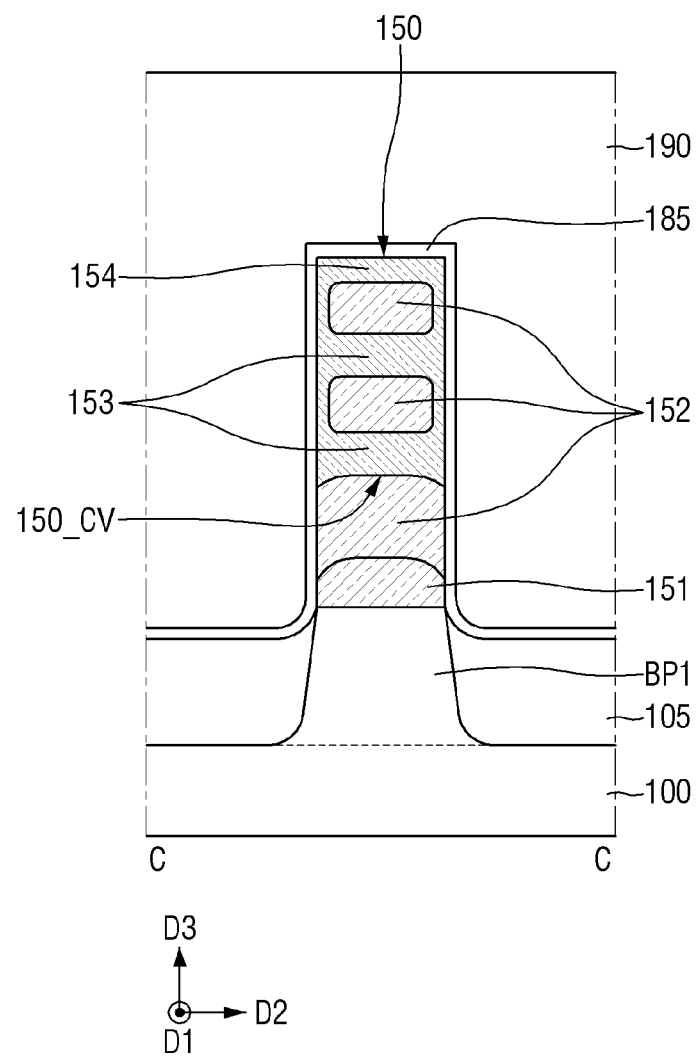
Figure 10:
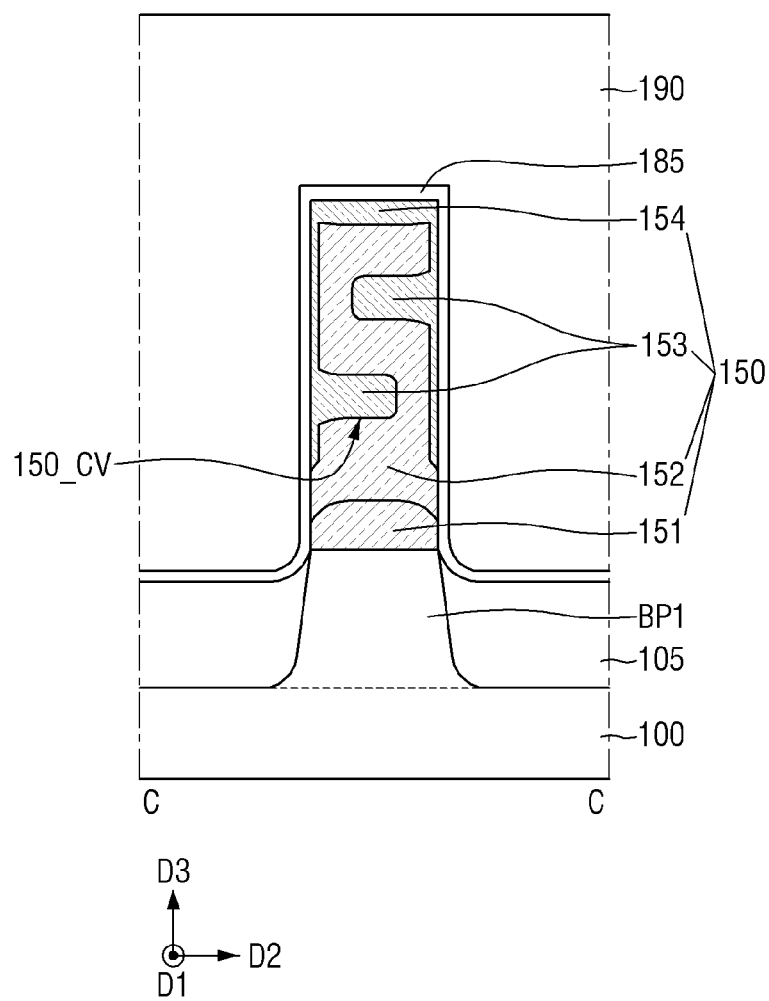

FIGS. 8 to 10 are diagrams of a semiconductor device according to some embodiments of the present invention. For convenience of explanation, the points different from those described using FIGS. 1 to 4B will be mainly described. For reference, FIGS. 9 and 10 are example cross-sectional views taken along the line C-C of FIG. 1.

Referring to FIGS. 8 to 10, in the semiconductor device according to some embodiments, the first source/drain pattern 150 further includes a core epitaxial region 153 that fills the cavity region 150_CV.

The first source/drain pattern 150 may further include a capping epitaxial region 154.

The capping epitaxial region 154 may be connected to the core epitaxial region 153 that fills the cavity region 150_CV. The capping epitaxial region 154 may be formed on the second epitaxial region 152.

In FIG. 9, the cavity region 150_CV may have, for example, the shape of a hole extending long in the second direction D2. In FIG. 10, the cavity region 150_CV may have a shape in which one end of the cavity region 150_CV is blocked by the second epitaxial region 152. The cross section of the cavity region 150_CV cut in the second direction D2 may have one of the form shown in FIG. 9 or the shape shown in FIG. 10, but is not limited thereto.

In FIG. 8, since the capping epitaxial region 154 may be formed before the second epitaxial region 152 is completely merged, the boundary between the capping epitaxial region 154 and the second epitaxial region 152 may have the shape of a curved surface that is convex toward the first lower pattern BP1.

The core epitaxial region 153 and the capping epitaxial region 154 may be formed at the same level. Here, the term "same level" means that they are formed by the same fabricating process. The core epitaxial region 153 and the capping epitaxial region 154 include the same material. Further, when impurities are doped in the core epitaxial region 153 and the capping epitaxial region 154, the core epitaxial region 153 and the capping epitaxial region 154 include the same doped impurities.

As an example, the core epitaxial region 153 and the capping epitaxial region 154 may include undoped silicon. Here, the term "undoped silicon" does not mean silicon that does not include impurity, but means silicon that does not contain an intentionally doped impurity. The meaning of "undoped" is self-evident to ordinary skilled person belonging to the technical field of the present invention.

As another example, the core epitaxial region 153 and the capping epitaxial region 154 may include silicon doped with phosphorus (P) which is a second n-type impurity. The concentration of phosphorus (P) of the core epitaxial region 153 and the capping epitaxial region 154 may be smaller than the concentration of phosphorus (P) of the second epitaxial region 152.

As still another example, the core epitaxial region 153 and the capping epitaxial region 154 may include silicon-germanium.

However, the above-mentioned materials of the core epitaxial region 153 and the capping epitaxial region 154 are only examples, and embodiments of the present invention are not limited thereto. That is, the core epitaxial region 153 and the capping epitaxial region 154 may include a semiconductor material that may fill the cavity region 150_CV.

Figure 11:
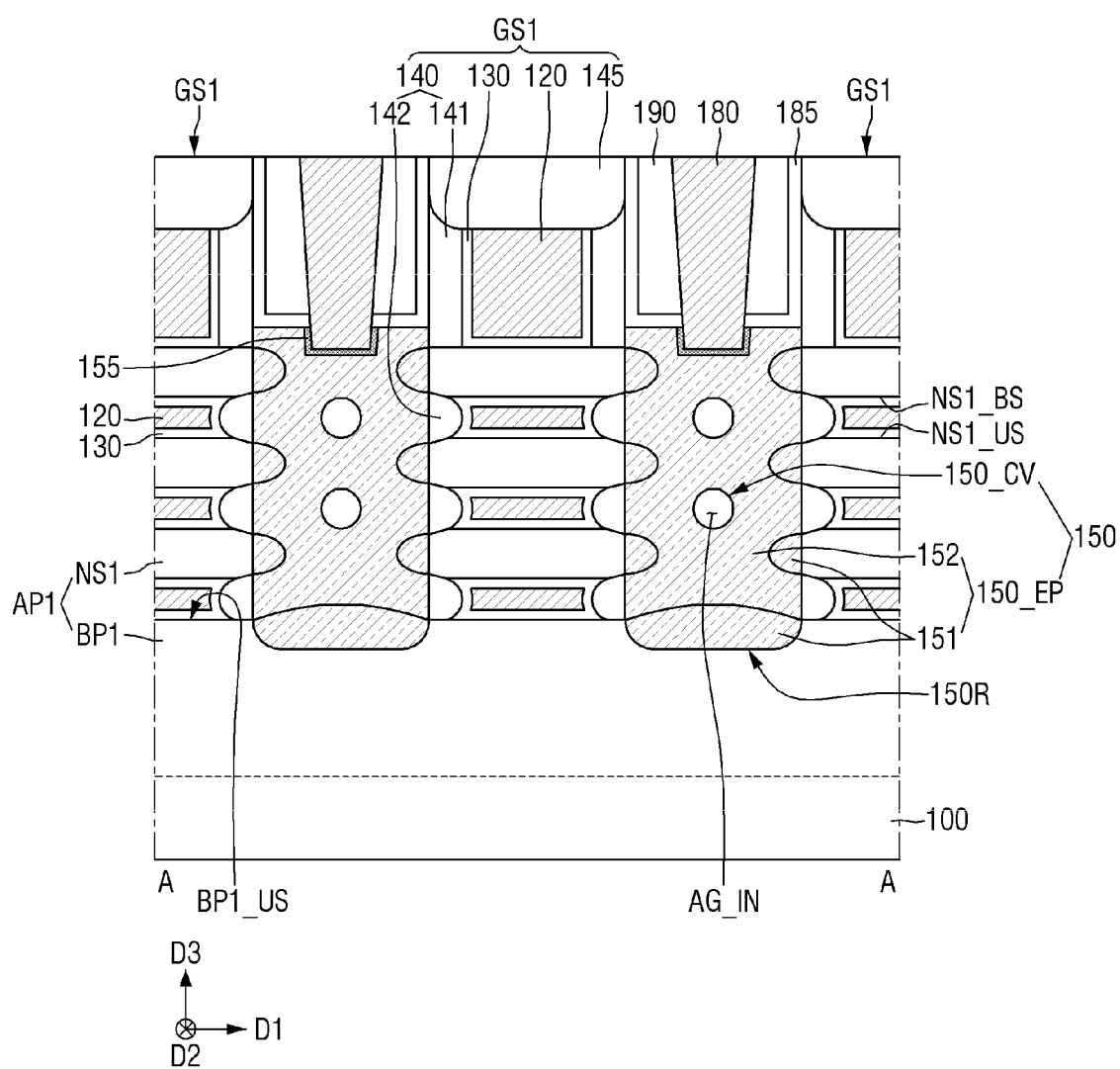
FIG. 11 is a diagram of a semiconductor device according to some embodiments of the present invention.
Figure 12:
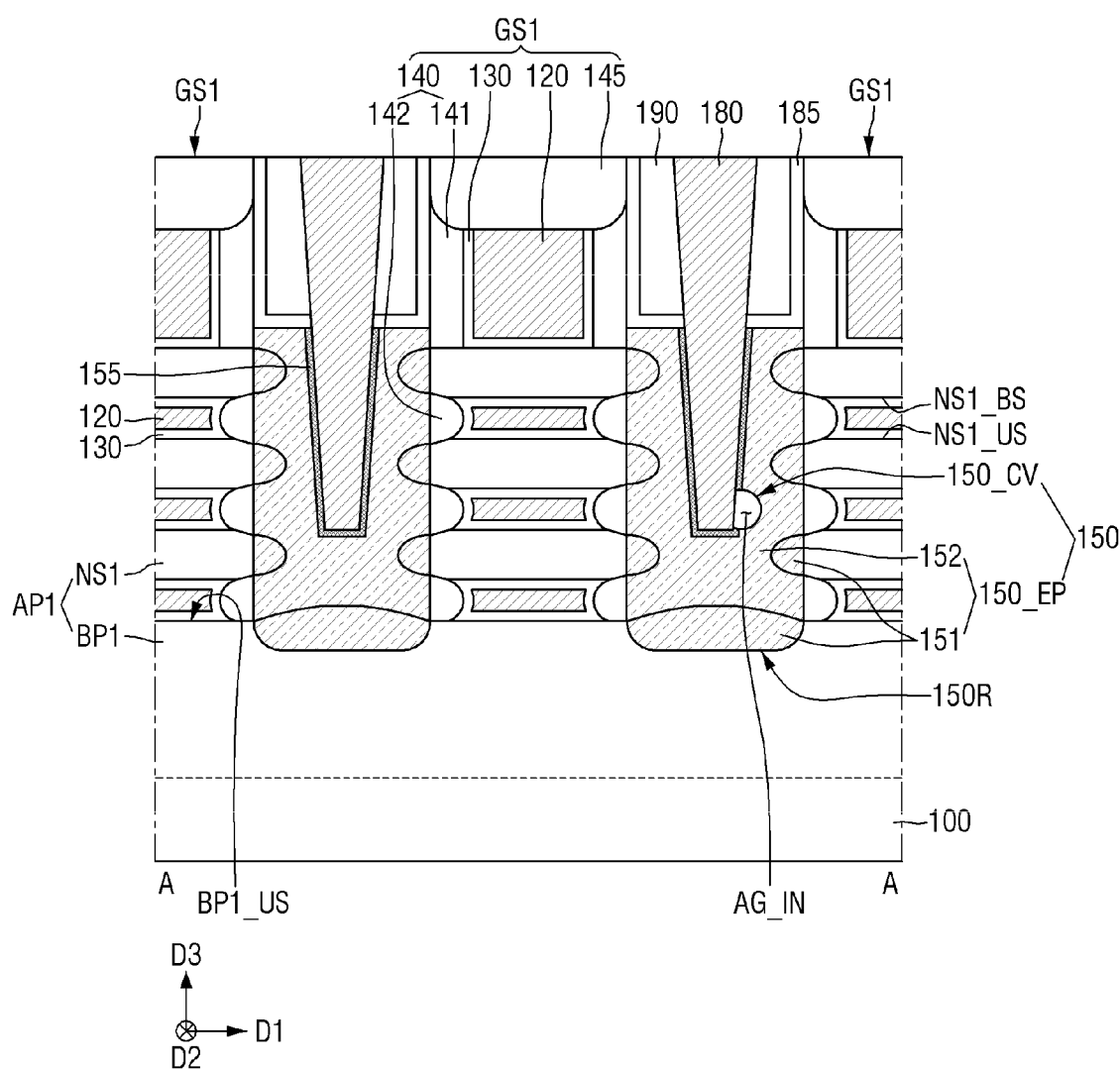
FIG. 12 is a diagram of a semiconductor device according to some embodiments of the present invention.

FIG. 11 is a diagram of a semiconductor device according to some embodiments of the present invention. FIG. 12 is a diagram of a semiconductor device according to some embodiments of the present invention. For convenience of explanation, the points different from those described using FIGS. 1 to 4B will be mainly described.

Referring to FIGS. 11 and 12, the semiconductor device according to some embodiments may further include a source/drain contact 180 placed on the first source/drain pattern 150.

The source/drain contact 180 is connected to the first source/drain pattern 150. The source/drain contact 180 passes through the interlayer insulating film 190 and the etching stop film 185, and may be connected to the first source/drain pattern 150.

A metal silicide film 155 may be further placed between the source/drain contact 180 and the first source/drain pattern 150.

In FIG. 11, the bottom surface of the source/drain contact 180 may be higher than the lower surface of the uppermost nanosheet among the first sheet patterns NS1.

In FIG. 12, the bottom surface of the source/drain contact 180 may be located between the lower surface of the lowermost sheet pattern among the first sheet patterns NS1 and the lower surface of the uppermost sheet pattern among the first sheet patterns NS1. In some embodiments, the source/drain contact 180 may intersect the cavity region 150_CV.

Although the source/drain contact 180 is shown as a single film, this is only for convenience of explanation, and the embodiments of the present invention are not limited thereto. The source/drain contact 180 may include, for example, at least one of a metal, a metal alloy, a conductive metal nitride, a conductive metal carbide, a conductive metal oxide, a conductive metal carbonitride, and/or a two-dimensional (2D) material.

The metal silicide film 155 may include a metal silicide.

Figure 13:
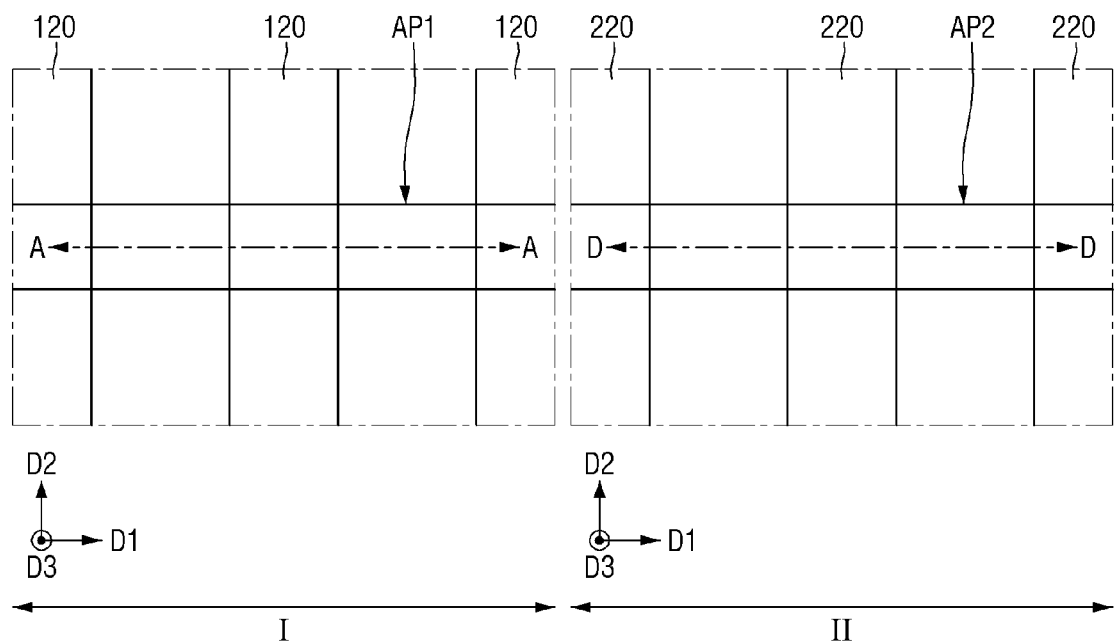
FIG. 13 is an example layout diagram of a semiconductor device according to some embodiments of the present invention.
Figure 14:
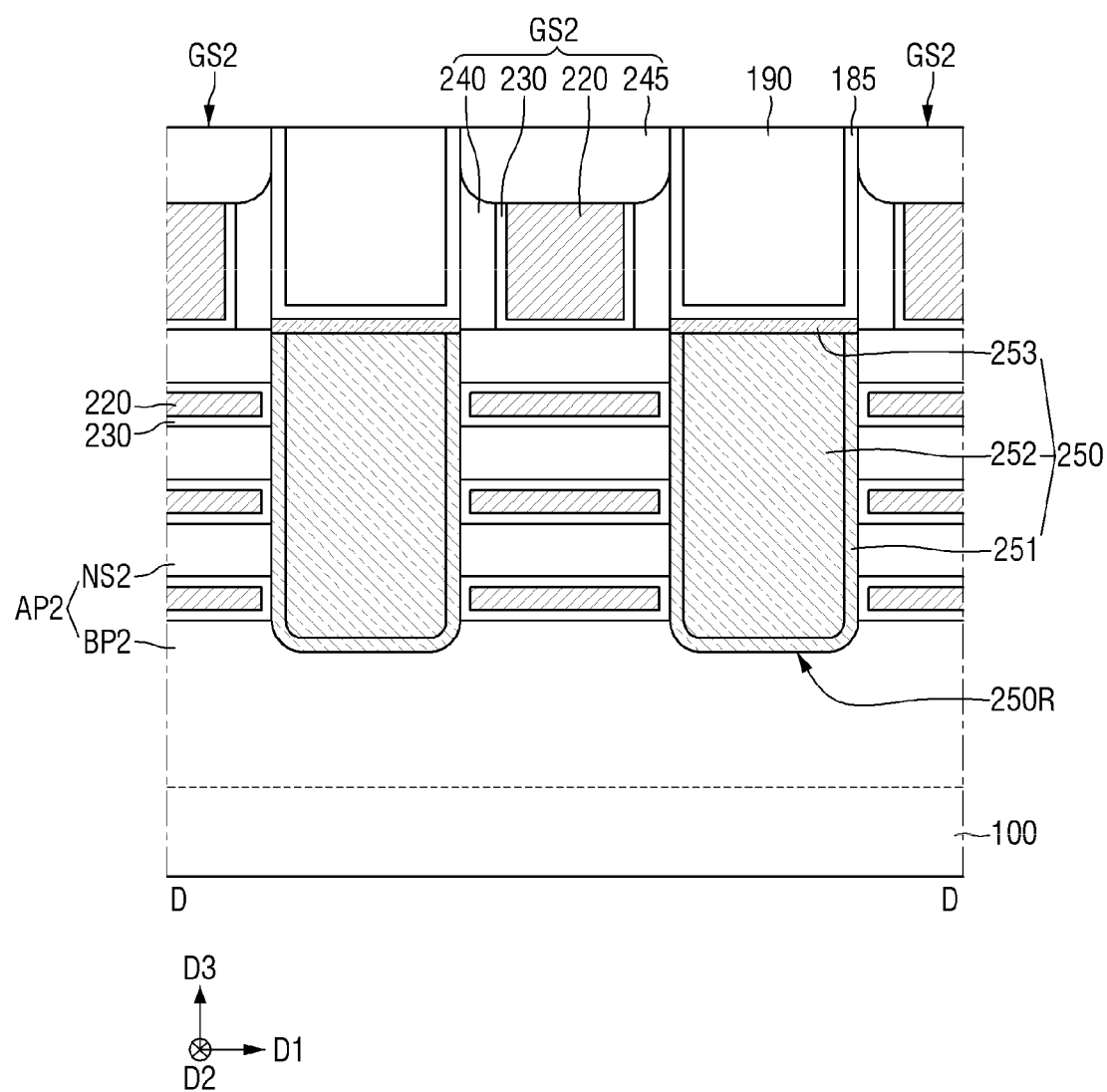
FIG. 14 is a cross-sectional view taken along the line D-D of FIG. 13.

FIG. 13 is an example layout diagram of a semiconductor device according to some embodiments of the present invention. FIG. 14 is a cross-sectional view taken along the line D-D of FIG. 13.

For reference, the cross-sectional view taken along the line A-A of FIG. 13 may be the same as one of FIGS. 2 and 5 to 8. In addition, the explanation of a first region I of FIG. 13 may be substantially the same as that described using FIGS. 1 to 10. Therefore, the following explanation will focus on the content relating to a second region II of FIG. 13.

Referring to FIGS. 13 and 14, the semiconductor device according to some embodiments of the present invention may include a first active pattern AP1, a plurality of first gate electrodes 120, a second active pattern AP2, a plurality of second gate electrodes 220, and a second source/drain pattern 250.

The substrate 100 may include the first region I and the second region II. The first region I may be a region in which a NMOS device is formed, and the second region II may be a region in which a PMOS device is formed.

The first active pattern AP1 and the plurality of first gate electrodes 120 are placed in the first region I of the substrate 100. The second active pattern AP2 and the plurality of second gate electrodes 220 are placed in the second region II of the substrate 100.

The second active pattern AP2 may include a second lower pattern BP2 and a plurality of second sheet patterns NS2. The second lower pattern BP2 may protrude from the substrate 100. The second lower pattern BP2 may extend long in the first direction D1. A plurality of second sheet patterns NS2 may be placed on the second lower pattern BP2. The plurality of second sheet patterns NS2 may be spaced apart from the second lower pattern BP2 in the third direction D3.

The second lower pattern BP2 and the second sheet pattern NS2 may include one of silicon or germanium, which is an elemental semiconductor material, a group IV-IV compound semiconductor, or a group III-V compound semiconductor. In the semiconductor device according to some embodiments, the second lower pattern BP2 may be a silicon lower pattern including silicon, and the second sheet pattern NS2 may be a silicon sheet pattern including silicon.

A plurality of second gate electrodes GS2 may be placed on the substrate 100. Each second gate structure GS2 may extend in the second direction D2. Adjacent second gate structures GS2 may be spaced apart from each other in the first direction D1.

The second gate structure GS2 may be placed on the second active pattern AP2. The second gate structure GS2 may intersect the second active pattern AP2. The second gate structure GS2 may intersect the second lower pattern BP2. The second gate structure GS2 may surround each second sheet pattern NS2.

The second gate structure GS2 may include, for example, a second gate electrode 220, a second gate insulating film 230, a second gate spacer 240, and a second gate capping pattern 245.

The second gate spacer 240 may not include an inner spacer, like the first gate spacer 140. That is, the second gate insulating film 230 may be in contact with the second source/drain pattern 250.

The explanation of the second gate electrode 220, the second gate insulating film 230, the second gate spacer 240, and the second gate capping pattern 245 is substantially the same as the explanation of the first gate electrode 120, the first gate insulating film 130, the first gate spacer 140, and the first gate capping pattern 145, and therefore, will not be provided below.

The second source/drain pattern 250 may be formed on the second active pattern AP2. The second source/drain pattern 250 may be formed on the second lower pattern BP2. The second source/drain pattern 250 may be connected to the second sheet pattern NS2.

The second source/drain pattern 250 may be placed on the side surfaces of the second gate structure GS2. The second source/drain pattern 250 may be placed between the second gate structures GS2 adjacent to each other in the first direction D1. For example, the second source/drain pattern 250 may be placed on either side of the second gate structure GS2. Unlike the shown configuration, the second source/drain pattern 250 may be placed on one side of the second gate structure GS2, and may not be placed on the other side of the second gate structure GS2.

The second source/drain pattern 250 may be included in a source/drain of a transistor that uses the second sheet pattern NS2 as a channel region.

The second source/drain pattern 250 may be placed inside the second source/drain recess 250R. The bottom surface of the second source/drain recess 250R may be defined by the second lower pattern BP2. The side walls of the second source/drain recess 250R may be defined by the second nanosheet NS2 and the second gate structure GS2. More specifically, the second gate insulating film 230 of the second gate structure GS2 may define a part of the second source/drain recess 250R.

The second source/drain pattern 250 may include a lower semiconductor pattern 251, an upper semiconductor pattern 252, and a capping semiconductor pattern 253. The lower semiconductor pattern 251, the upper semiconductor pattern 252, and the capping semiconductor pattern 253 may each be an epitaxial semiconductor region.

The lower semiconductor pattern 251 and the upper semiconductor pattern 252 may each include silicon-germanium. In some embodiments, the lower semiconductor pattern 251 and the upper semiconductor pattern 252 may each include a silicon-germanium film. For example, a germanium fraction of the lower semiconductor pattern 251 may be smaller than a germanium fraction of the upper semiconductor pattern 252.

The lower semiconductor pattern 251 and the upper semiconductor pattern 252 may each include a doped p-type impurity. The p-type impurity may be, for example, but is not limited to, boron (B).

The capping semiconductor pattern 253 may be formed on the lower semiconductor pattern 251 and the upper semiconductor pattern 252. The capping semiconductor pattern 253 may include, for example, silicon.

Although the silicon-germanium semiconductor patterns of two layers are shown as being placed below the capping semiconductor pattern 253, this is only for convenience of explanation, and the embodiments of the present invention are not limited thereto.

FIGS. 15 to 21 are intermediate stage diagrams of a method for fabricating a semiconductor device according to some embodiments of the present invention. For reference, FIGS. 15 to 21 may be cross-sectional views taken along the line A-A of FIG. 1. The following fabricating method will be described in terms of cross-sectional view.

Figure 15:
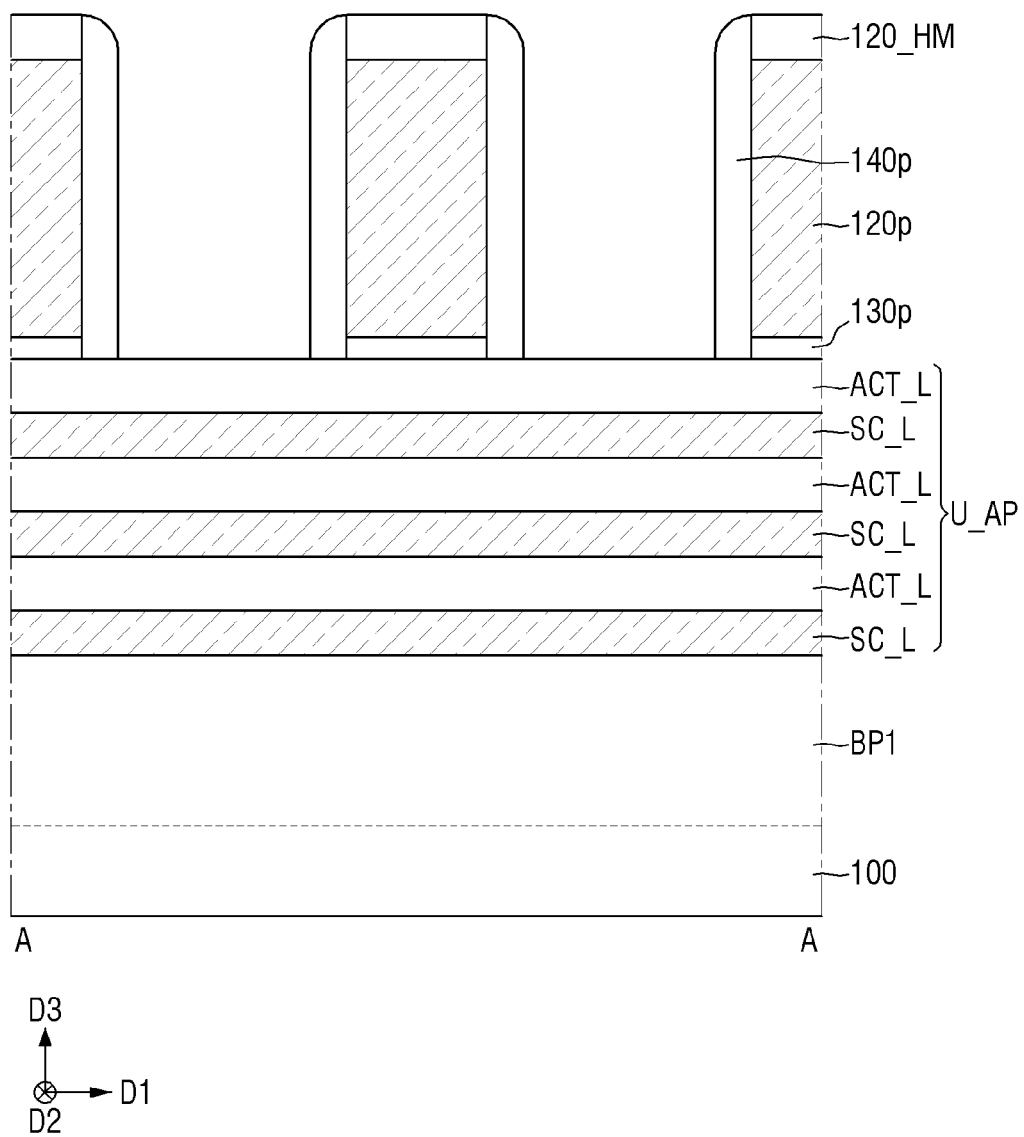
FIGS. 15 to 21 are intermediate stage diagrams of a method for fabricating a semiconductor device according to some embodiments of the present invention.

Referring to FIG. 15, the first lower pattern BP1 and the upper pattern structure U_AP may be formed on the substrate 100.

The upper pattern structure U_AP may be placed on the first lower pattern BP1. The upper pattern structure U_AP may include a sacrificial pattern SC_L and an active pattern ACT_L alternately stacked on the first lower pattern BP1.

For example, the sacrificial pattern SC_L may include a silicon-germanium film. The active pattern ACT_L may include a silicon film.

Subsequently, a dummy gate insulating film 130p, a dummy gate electrode 120p, and a dummy gate capping film 120_HM may be formed on the upper pattern structure U_AP. The dummy gate insulating film 130p may include, but is not limited to, for example, silicon oxide. The dummy gate electrode 120p may include, but is not limited to, for example, polysilicon. The dummy gate capping film 120_HM may include, but is not limited to, for example, silicon nitride.

A pre gate spacer 140p may be formed on the side walls of the dummy gate electrode 120p.

Figure 16:
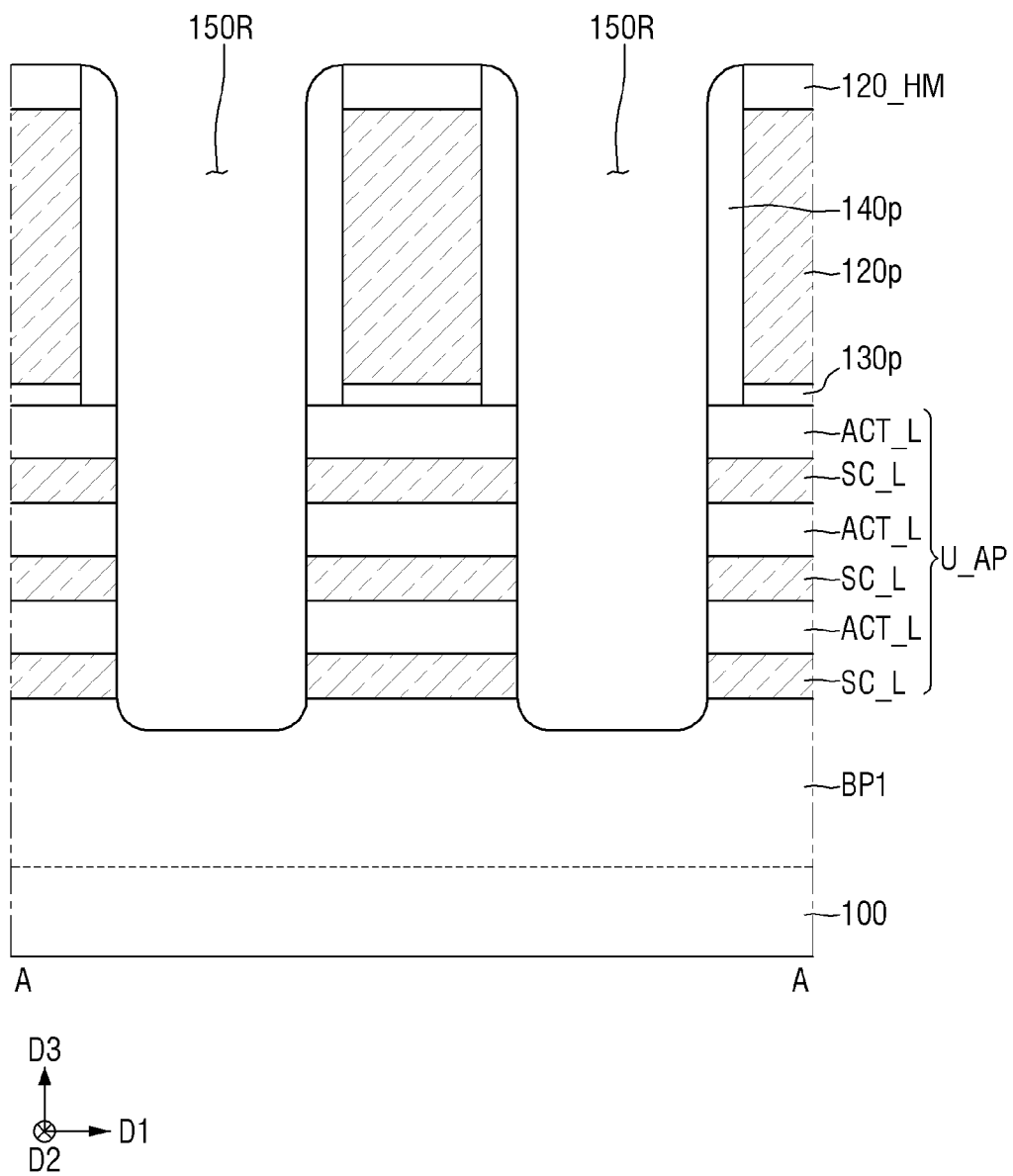

Referring to FIG. 16, a first source/drain recess 150R may be formed inside the upper pattern structure U_AP, using the dummy gate electrode 120p as a mask.

A part of the first source/drain recess 150R may be formed inside the first lower pattern BP1.

Figure 17:
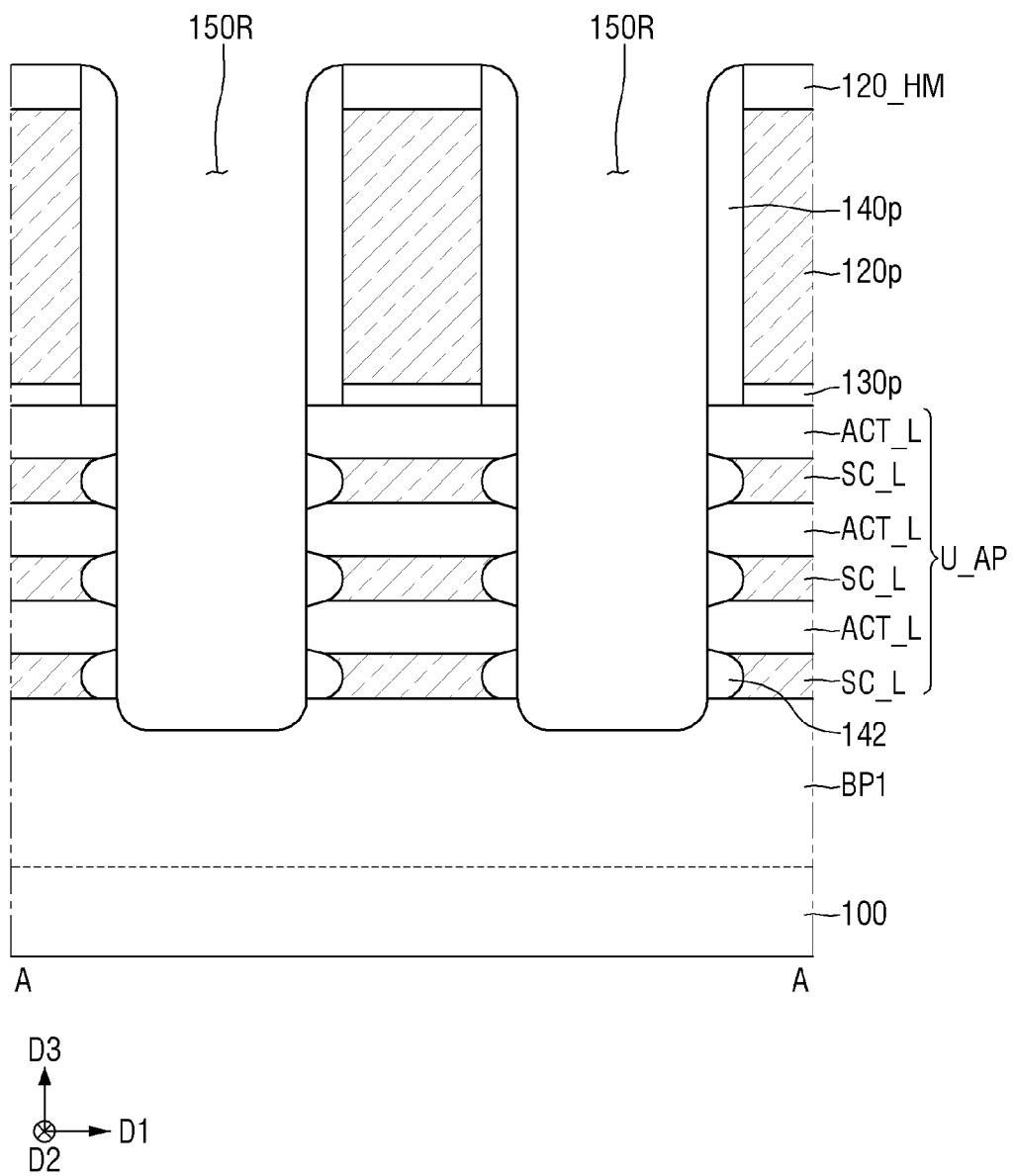

Referring to FIG. 17, a part of the sacrificial pattern SC_L exposed by the first source/drain recess 150R may be removed.

Subsequently, the inner spacer 142 may be formed at a position from which a part of the sacrificial pattern SC_L is removed.

Figure 18:
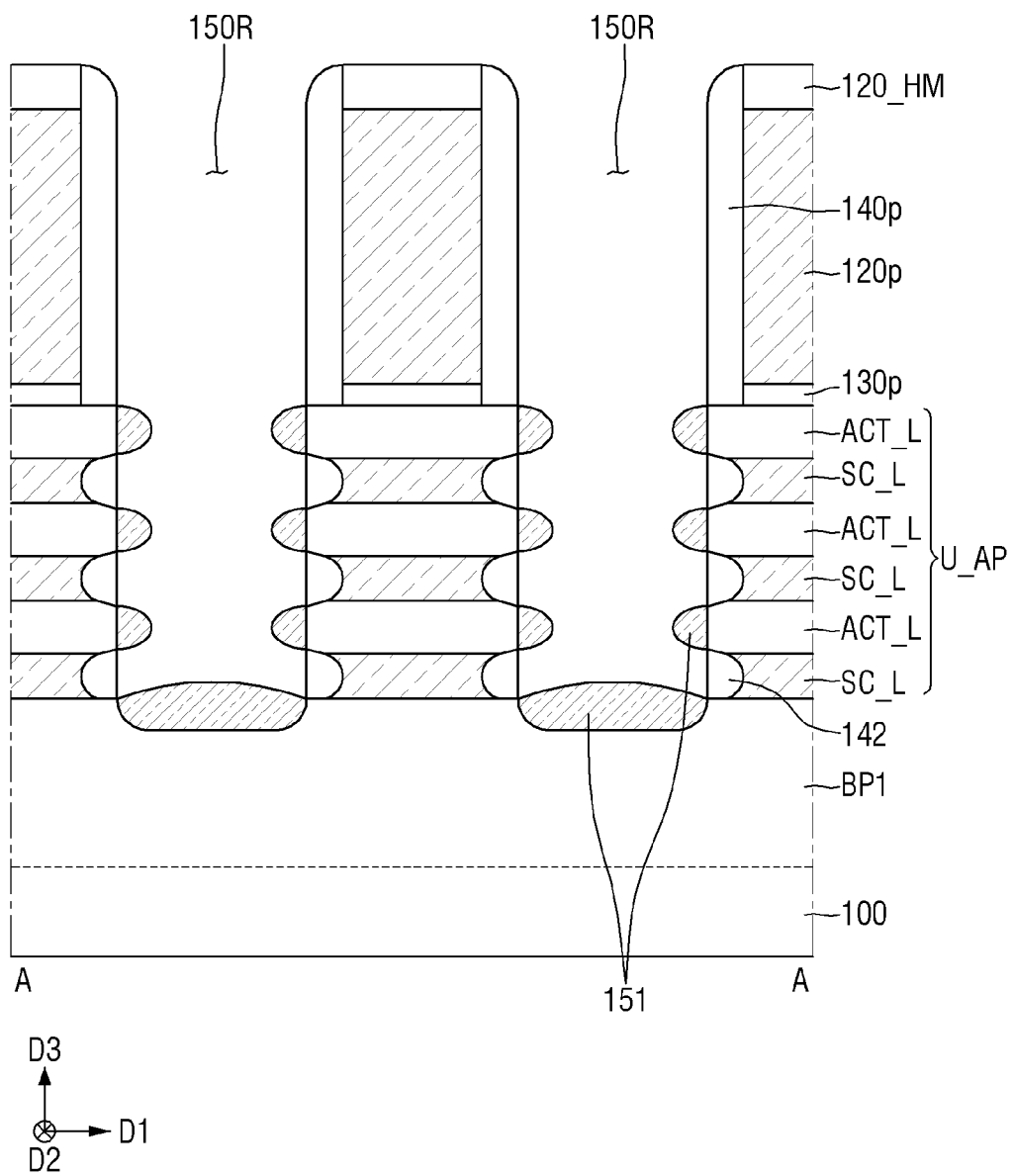

Referring to FIG. 18, a plurality of first epitaxial regions 151 spaced apart from each other may be formed along the profile of the first source/drain recess 150R.

Each first epitaxial region 151 may be formed on the first sheet pattern NS1 and the first lower pattern BP1 exposed by the first source/drain recess 150R.

Figure 19A:
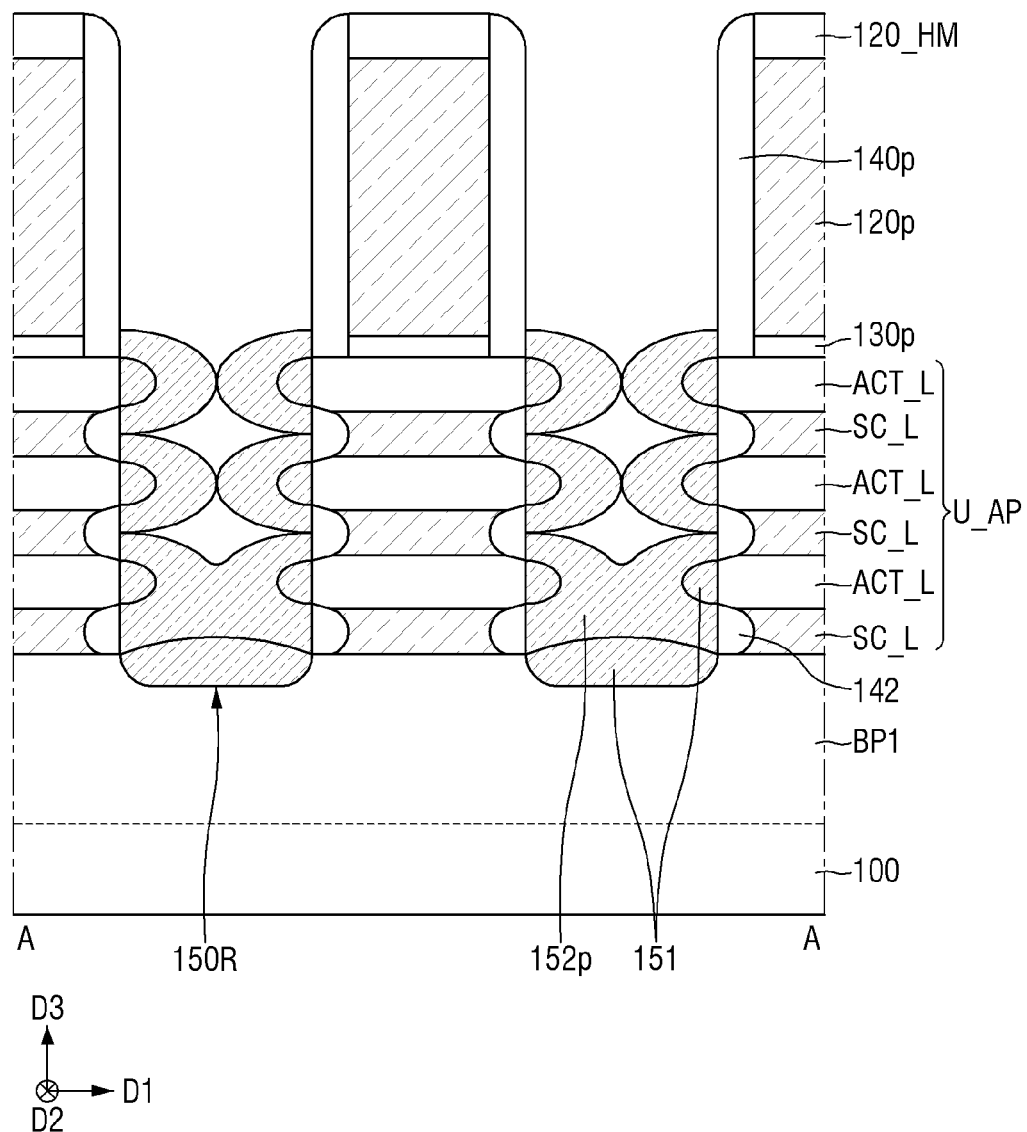
Figure 19B:
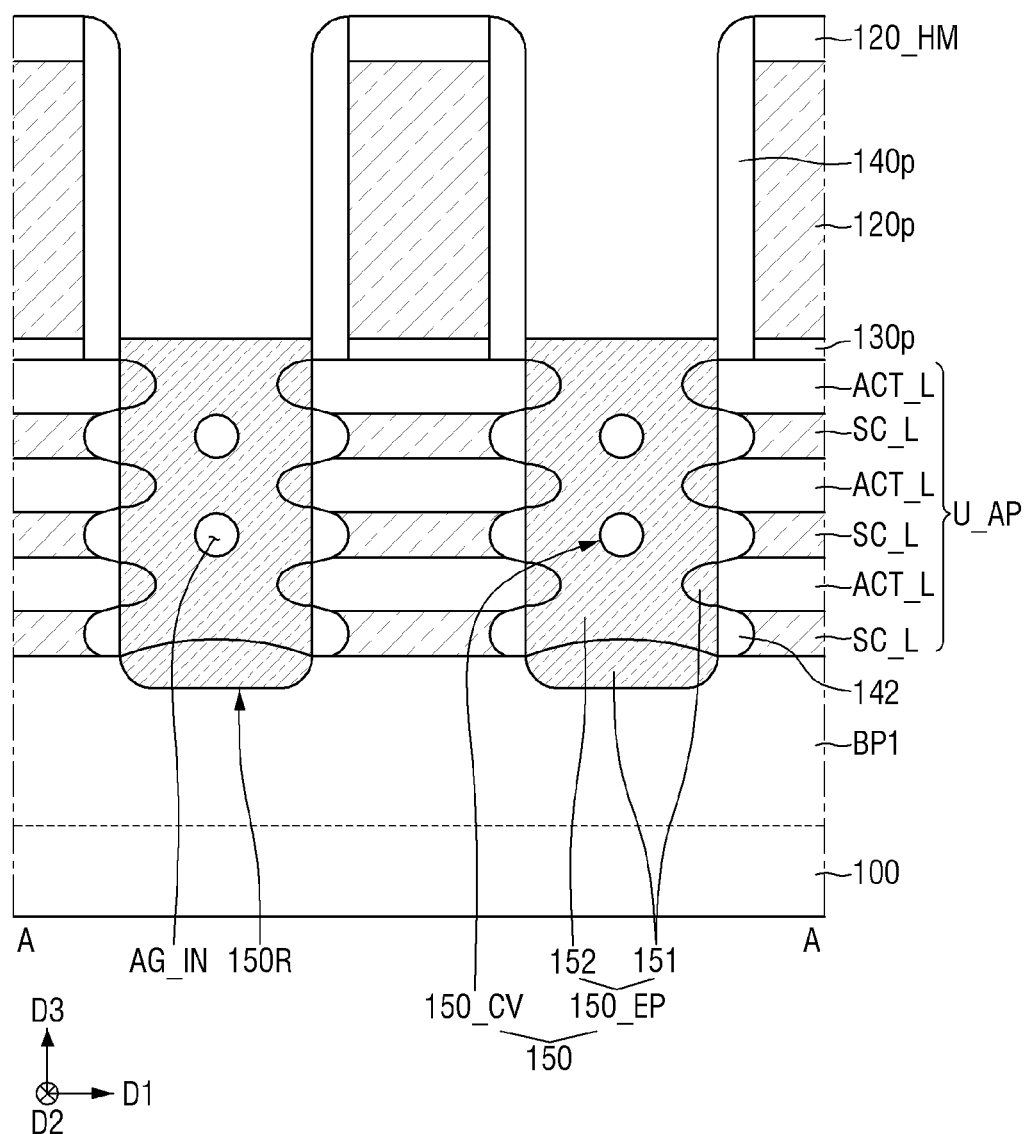

Referring to FIGS. 19A and 19B, a pre second epitaxial region 152p may be formed on each first epitaxial region 151.

The pre second epitaxial region 152p may fill a part of the first source/drain recess 150R. However, the pre second epitaxial regions 152p formed on each first epitaxial region 151 may be before being merged together.

Subsequently, the pre second epitaxial region 152p may be continuously grown. As a result, a second epitaxial region 152 may be formed. A cavity region 150_CV surrounded by the second epitaxial region 152 may be formed inside the second epitaxial region 152.

That is, the first source/drain pattern 150 including the epitaxial region 150_EP and the cavity region 150_CV may be formed inside the first source/drain recess 150R. The cavity region 150_CV may include the inner air gap AG_IN.

Unlike the shown configuration, the core epitaxial region 153 and the capping epitaxial region 154 described in FIGS. 8 to 10 may be formed subsequent to FIG. 19A.

Figure 20:
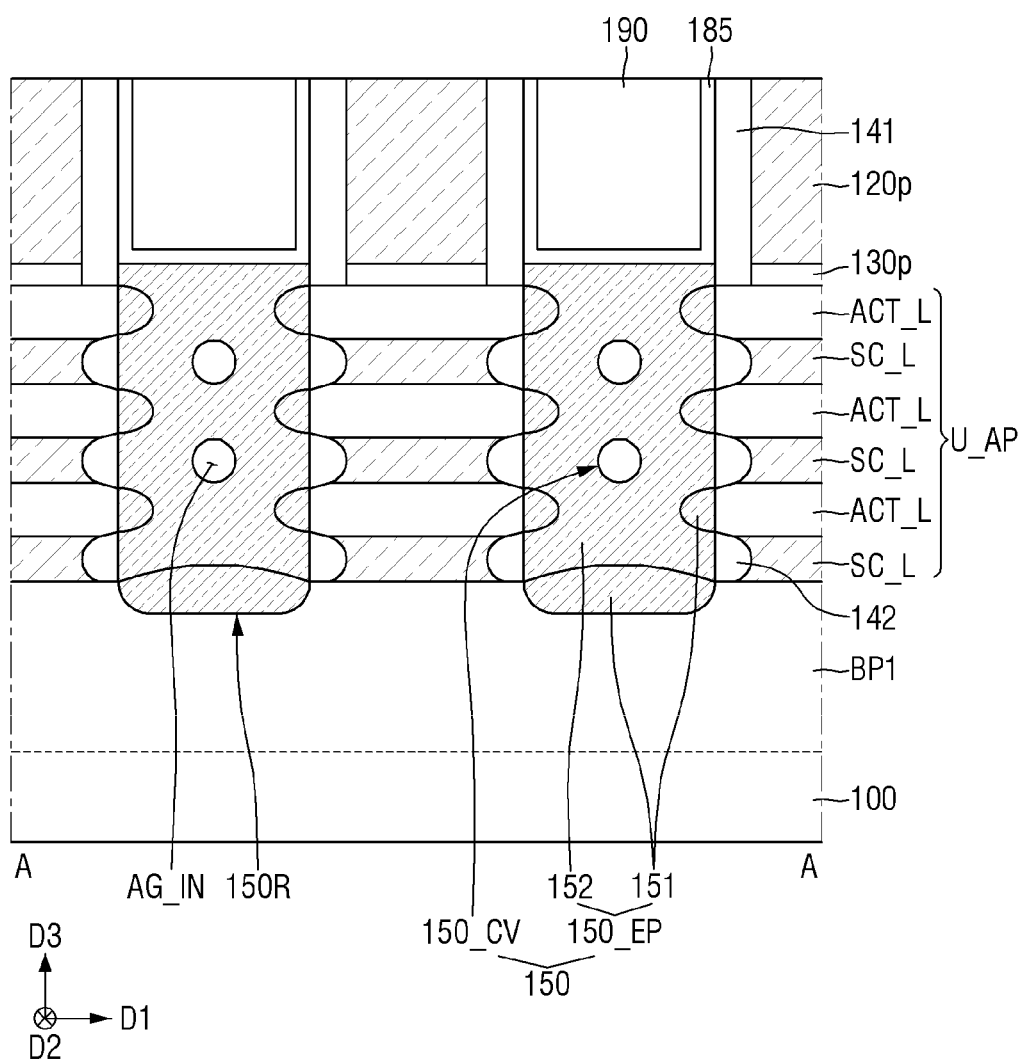

Referring to FIG. 20, the etching stop film 185 and the interlayer insulating film 190 are sequentially formed on the first source/drain pattern 150.

Subsequently, a part of the interlayer insulating film 190, a part of the etching stop film 185, and the dummy gate capping film 120_HM are removed to expose the upper surface of the dummy gate electrode 120p. An outer spacer 141 may be formed, while the upper surface of the dummy gate electrode 120p is being exposed.

Figure 21:
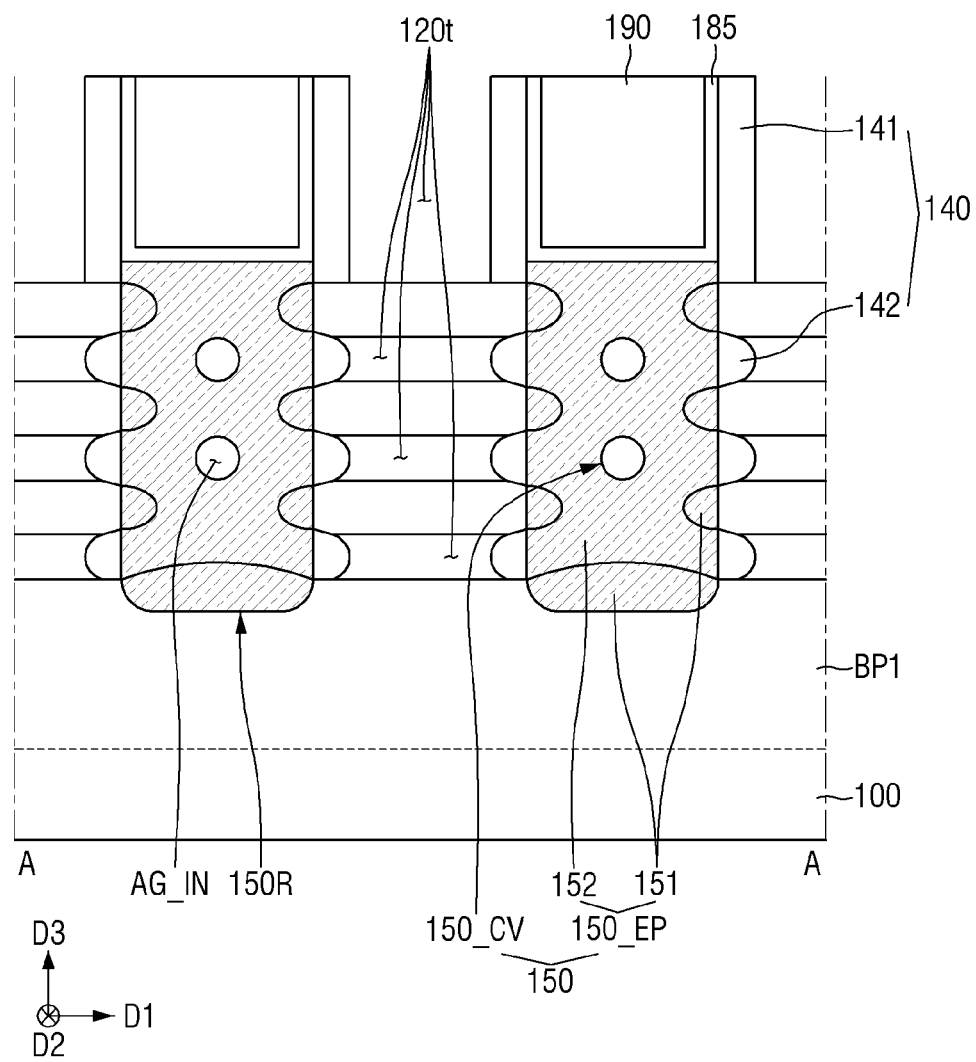

Referring to FIG. 21, by removing the dummy gate insulating film 130p and the dummy gate electrode 120p, the upper pattern structure U_AP between the first gate spacers 140 may be exposed.

Subsequently, the sacrificial pattern SC_L may be removed to form the first sheet pattern NS1. As a result, a first gate trench 120t is formed between the first gate spacers 140. When the sacrificial pattern SC_L is removed, the inner spacer 142 may be exposed.

Subsequently, referring to FIG. 2, the first gate insulating film 130 and the first gate electrode 120 may be formed inside the first gate trench 120t. Moreover, the first gate capping pattern 145 may be formed.

In concluding the detailed description, those skilled in the art will appreciate that many variations and modifications may be made to the example embodiments without substantially departing from the scope of the present invention. Therefore, the disclosed example embodiments of the invention are used in a generic and descriptive sense only and not for purposes of limitation.

What is claimed is:

1. A semiconductor device comprising:
an active pattern comprising a lower pattern and a plurality of sheet patterns, the plurality of sheet patterns spaced apart from the lower pattern in a first direction;
a source/drain pattern on the lower pattern and in contact with the plurality of sheet patterns; and
a gate structure on opposing sides of the source/drain pattern in a second direction different from the first direction, the gate structure comprising a gate electrode on the plurality of sheet patterns,
wherein the source/drain pattern comprises an epitaxial region that comprises a semiconductor material and a cavity region that is inside the epitaxial region and that is entirely surrounded by the semiconductor material.

2. The semiconductor device of claim 1, wherein the cavity region comprises an inner air gap.

3. The semiconductor device of claim 2, wherein a portion of the gate electrode that is between a pair of the plurality of sheet patterns that are adjacent to each other in the first direction overlaps the inner air gap in the second direction.

4. The semiconductor device of claim 1, wherein the gate structure further comprises an inner spacer between a pair of the plurality of sheet patterns that are adjacent to each other in the first direction, and
wherein the inner spacer is between the gate electrode and the source/drain pattern.

5. The semiconductor device of claim 4, wherein the gate structure comprises a gate insulating film between the gate electrode and each of the plurality of sheet patterns, and
wherein the gate insulating film is in contact with the inner spacer.

6. The semiconductor device of claim 4, further comprising an outer air gap between the inner spacer and the source/drain pattern.

7. The semiconductor device of claim 6, wherein the outer air gap is surrounded by the inner spacer and the epitaxial region.

8. The semiconductor device of claim 1, wherein the source/drain pattern further comprises a core epitaxial region within the cavity region.

9. The semiconductor device of claim 1, wherein the epitaxial region comprises a plurality of first epitaxial regions comprising silicon doped with a first impurity, and a second epitaxial region comprising a second impurity different from the first impurity.

10. The semiconductor device of claim 1, wherein the cavity region includes a first cavity region and a second cavity region, and
wherein each of the first cavity region and the second cavity region is entirely surrounded by the semiconductor material.

11. A semiconductor device comprising:
an active pattern comprising a lower pattern and a plurality of sheet patterns, the plurality of sheet patterns spaced apart from the lower pattern in a first direction;
a plurality of gate structures on the lower pattern that are spaced apart from each other in a second direction different from the first direction, the plurality of gate structures each comprising a gate electrode on one or more of the plurality of sheet patterns;
a source/drain recess between a pair of the plurality of gate structures that are adjacent to each other in the second direction; and
a source/drain pattern that is inside the source/drain recess on the lower pattern and is in contact with the one or more of the plurality of sheet patterns,
wherein the source/drain pattern comprises an epitaxial region that comprises a semiconductor material and a cavity region that is inside the epitaxial region and that is entirely surrounded by the semiconductor material, and
wherein the epitaxial region comprises a plurality of first epitaxial regions that are spaced apart from each other along a profile of the source/drain recess and a second epitaxial region that extends between the plurality of first epitaxial regions.

12. The semiconductor device of claim 11, wherein the cavity region comprises an inner air gap.

13. The semiconductor device of claim 12, wherein the inner air gap is surrounded by the second epitaxial region.

14. The semiconductor device of claim 11, wherein at least one of the plurality of gate structures further comprises an inner spacer between a pair of the plurality of sheet patterns that are adjacent to each other in the first direction, and
wherein a part of the source/drain recess is adjacent the inner spacer.

15. The semiconductor device of claim 14, wherein the plurality of first epitaxial regions does not extend along the source/drain recess defined by the inner spacer.

16. The semiconductor device of claim 14, further comprising an outer air gap between the inner spacer and the second epitaxial region.

17. The semiconductor device of claim 11, wherein each of the plurality of first epitaxial regions comprises silicon doped with an n-type first impurity, and
wherein the second epitaxial region comprises silicon doped with an n-type second impurity that is different from the n-type first impurity.

18. A semiconductor device comprising:
an active pattern comprising a lower pattern and a plurality of sheet patterns, the plurality of sheet patterns spaced apart from the lower pattern in a first direction;
a source/drain pattern on the lower pattern and in contact with the plurality of sheet patterns; and
a gate structure on opposing sides of the source/drain pattern in a second direction different from the first direction,
wherein the gate structure comprises a gate electrode on the plurality of sheet patterns and an inner spacer between a pair of the plurality of sheet patterns that are adjacent to each other in the first direction,
wherein the source/drain pattern comprises an epitaxial region that comprises a semiconductor material and an inner air gap that is inside the epitaxial region and that is entirely surrounded by the semiconductor material, and
wherein the inner air gap is not in contact with the inner spacer.

19. The semiconductor device of claim 18, further comprising an outer air gap between the inner spacer and the source/drain pattern, the outer air gap being surrounded by the inner spacer and the epitaxial region.

20. The semiconductor device of claim 18, wherein the epitaxial region comprises a plurality of first epitaxial regions that are on respective ones of the plurality of sheet patterns and a second epitaxial region that extends between the plurality of first epitaxial regions,
wherein the first epitaxial regions are separated from each other,
wherein the second epitaxial region surrounds the inner air gap, wherein each of the first epitaxial regions comprises silicon doped with an n-type first impurity, and wherein the second epitaxial region comprises silicon doped with an n-type second impurity that is different from the n-type first impurity.

* * * * *